US010942216B2

(12) United States Patent
Kim et al.

(10) Patent No.: US 10,942,216 B2
(45) Date of Patent: Mar. 9, 2021

(54) APPARATUS AND METHOD FOR TESTING AN INTERCONNECT CIRCUIT AND METHOD FOR MANUFACTURING A SEMICONDUCTOR DEVICE INCLUDING THE TEST METHOD

(71) Applicant: SAMSUNG ELECTRONICS CO., LTD., Suwon-si (KR)

(72) Inventors: Sung-Yeol Kim, Yongin-si (KR); Jae-Hong Kim, Seoul (KR); Kyung-Min Lee, Gwacheon-si (KR); Mee-Hyun Lim, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 284 days.

(21) Appl. No.: 15/958,387

(22) Filed: Apr. 20, 2018

(65) Prior Publication Data

US 2019/0113565 A1    Apr. 18, 2019

(30) Foreign Application Priority Data

Oct. 12, 2017  (KR) .................. 10-2017-0132750

(51) Int. Cl.
| | | |
|---|---|---|
| *G01R 31/28* | (2006.01) | |
| *G01N 21/95* | (2006.01) | |
| *G01R 1/07* | (2006.01) | |
| *G02F 1/13* | (2006.01) | |
| *G01N 21/88* | (2006.01) | |

(52) U.S. Cl.
CPC ..... *G01R 31/2853* (2013.01); *G01N 21/8806* (2013.01); *G01N 21/9501* (2013.01); *G01R 1/071* (2013.01); *G02F 1/1309* (2013.01)

(58) Field of Classification Search
CPC ........... G01N 21/8806; G01N 21/9501; G01R 1/071; G01R 15/241; G01R 31/2853; G01R 31/2884; G01R 1/0408; G01R 31/3808; G01R 31/2818; G01R 31/66; G02F 1/1309
USPC ....................................................... 324/538
See application file for complete search history.

(56) References Cited

U.S. PATENT DOCUMENTS 5,030,829 A * 7/1991 Plies .................... G01R 31/308
                                                         250/330
5,585,735 A * 12/1996 Takahashi .............. G01R 1/071
                                                         324/754.23
5,781,003 A    7/1998 Kondo
(Continued)

FOREIGN PATENT DOCUMENTS

| JP | 2008102031 | 5/2008 |
| KR | 10-0243779 | 11/1999 |

(Continued)

*Primary Examiner* — Tung X Nguyen
*Assistant Examiner* — Robert P Alejnikov, Jr.
(74) *Attorney, Agent, or Firm* — F. Chau & Associates, LLC

(57) ABSTRACT

An interconnect circuit testing apparatus including: an electric signal generating circuit for generating an electric signal; a first electrode arranged at a first region of a substrate, wherein the substrate includes an interconnect circuit, an upper surface and a lower surface; a second electrode arranged at a second region of the substrate; and a sensor for detecting an electric field emitted from the first region or the second region when the electric signal is applied to the substrate through the first electrode and the second electrode.

13 Claims, 17 Drawing Sheets

(56) References Cited

U.S. PATENT DOCUMENTS

| | | | |
|---|---|---|---|
| 6,573,699 B1* | 6/2003 | Hama | G01R 1/071 |
| | | | 324/73.1 |
| 6,833,716 B1 | 12/2004 | Goruganthu et al. | |
| 7,250,785 B2 | 7/2007 | Kawaike et al. | |
| 8,378,708 B2 | 2/2013 | Jun et al. | |
| 2005/0242824 A1* | 11/2005 | Parker | G01R 31/52 |
| | | | 324/538 |
| 2006/0103378 A1* | 5/2006 | Pakdaman | G01R 31/311 |
| | | | 324/228 |
| 2010/0194414 A1* | 8/2010 | Jun | G01R 31/308 |
| | | | 324/754.23 |
| 2015/0022198 A1 | 1/2015 | David et al. | |
| 2015/0298590 A1* | 10/2015 | Lamesch | H03K 17/962 |
| | | | 324/538 |
| 2015/0377795 A1 | 12/2015 | Zhao et al. | |
| 2016/0011237 A1* | 1/2016 | Konno | G01R 15/246 |
| | | | 324/96 |
| 2016/0377561 A1* | 12/2016 | Ramachandran | |
| | | | G01N 21/95607 |
| | | | 250/307 |
| 2017/0010291 A1* | 1/2017 | Feingold | G06F 19/3456 |
| 2017/0262112 A1* | 9/2017 | Noguchi | G02F 1/134336 |

FOREIGN PATENT DOCUMENTS

| | | |
|---|---|---|
| KR | 1020000071474 | 11/2000 |
| KR | 1020110035574 | 4/2011 |
| KR | 10-1039049 | 5/2011 |
| KR | 10-1376935 | 3/2014 |

* cited by examiner

APPARATUS AND METHOD FOR TESTING AN INTERCONNECT CIRCUIT AND METHOD FOR MANUFACTURING A SEMICONDUCTOR DEVICE INCLUDING THE TEST METHOD

CROSS-REFERENCE TO RELATED APPLICATION

This application claims priority under 35 U.S.C. 119 to Korean Patent Application No. 10-2017-0132750, filed on Oct. 12, 2017, in the Korean Intellectual Property Office, the disclosure of which is incorporated by reference herein in its entirety.

TECHNICAL FIELD

The inventive concept relates to a testing apparatus and method, and more particularly, to an apparatus and method for detecting whether an interconnect circuit is normal.

DISCUSSION OF RELATED ART

In many individual semiconductor parts, various circuits are formed in a silicon interconnect circuit board to change or transmit an electrical signal. The silicon interconnect circuit board may be more highly integrated than a printed circuit board (PCB) interconnect circuit board. However, the silicon interconnect circuit board has a fine line width and a more complicated interconnect circuit.

Recent packing technology integrates a system in a package by connecting different kinds of chips on one semiconductor die. In this technology, an interconnect circuit board may include anywhere from ten thousand to a hundred thousand interconnect circuits. Defects in an individual interconnect circuit may be detected by measuring resistances of both ends of the interconnect circuit. However, a large number of interconnects of the interconnect circuit board and newly added processes make probing inefficient and costly.

SUMMARY

According to an exemplary embodiment of the inventive concept, there is provided an interconnect circuit testing apparatus including an electric signal generating circuit for generating an electric signal; a first electrode arranged at a first region of a substrate, wherein the substrate includes an interconnect circuit, an upper surface and a lower surface; a second electrode arranged at a second region of the substrate; and a sensor for detecting an electric field emitted from the first region or the second region when the electric signal is applied to the substrate through the first electrode and the second electrode.

According to an exemplary embodiment of the inventive concept, there is provided an interconnect circuit testing apparatus including an apparatus body for generating an electric signal; a first electrode electrically connected to the apparatus body and arranged at a first region of an interconnect circuit board in which an interconnect circuit is formed; a second electrode electrically connected to the apparatus body and arranged at a second region of the interconnect circuit board to generate a potential difference between the first electrode and the second electrode in response to the electric signal so that an electric field of a part of the interconnect circuit of the second region has a detectable shape; and a sensor arranged between the second electrode and the interconnect circuit board to detect the electric field.

According to an exemplary embodiment of the inventive concept, there is provided a method of testing an interconnect circuit, including applying an electric signal to an interconnect circuit board by using two electrodes arranged at a first region and a second region of the interconnect circuit board in which the interconnect circuit is formed; generating an electric field in the second region; detecting the electric field by using a sensor arranged at the second region; calculating an intensity of the electric field at a pad and a resistance value of a corresponding interconnect from detected electric field data from the sensor; and determining whether the interconnect circuit board is normal based on the intensity of the electric field and the resistance value.

According to an exemplary embodiment of the inventive concept, there is provided a method of manufacturing a semiconductor device, including applying an electric signal to an interconnect circuit board by using two electrodes arranged at a first region and a second region of the interconnect circuit board in which an interconnect circuit is formed; generating an electric field in the second region; detecting the electric field by using a sensor arranged at the second region; calculating an intensity of the electric field at a pad and a resistance value of a corresponding interconnect from detected electric field data from the sensor; determining whether the interconnect circuit board is normal based on the intensity of the electric field and the resistance value; and performing a subsequent process when the interconnect circuit board is normal.

According to an exemplary embodiment of the inventive concept, there is provided an interconnect circuit testing apparatus including a first electrode disposed at a first region of an interconnect circuit board; a second electrode disposed at a second region of the interconnect circuit board; an electric signal generating circuit for generating an electric signal and applying the electric signal to the first and second electrodes, wherein an electric field is emitted from the interconnect circuit board in response to a potential difference between the first and second electrodes; and a sensor disposed at the second region of the interconnect circuit board, wherein the sensor detects an intensity of the electric field.

BRIEF DESCRIPTION OF THE DRAWINGS

The above and other features of the inventive concept will be more clearly understood by describing in detail exemplary embodiments thereof with reference to the accompanying drawings in which.

DETAILED DESCRIPTION OF THE EMBODIMENTS

Figure 1A:
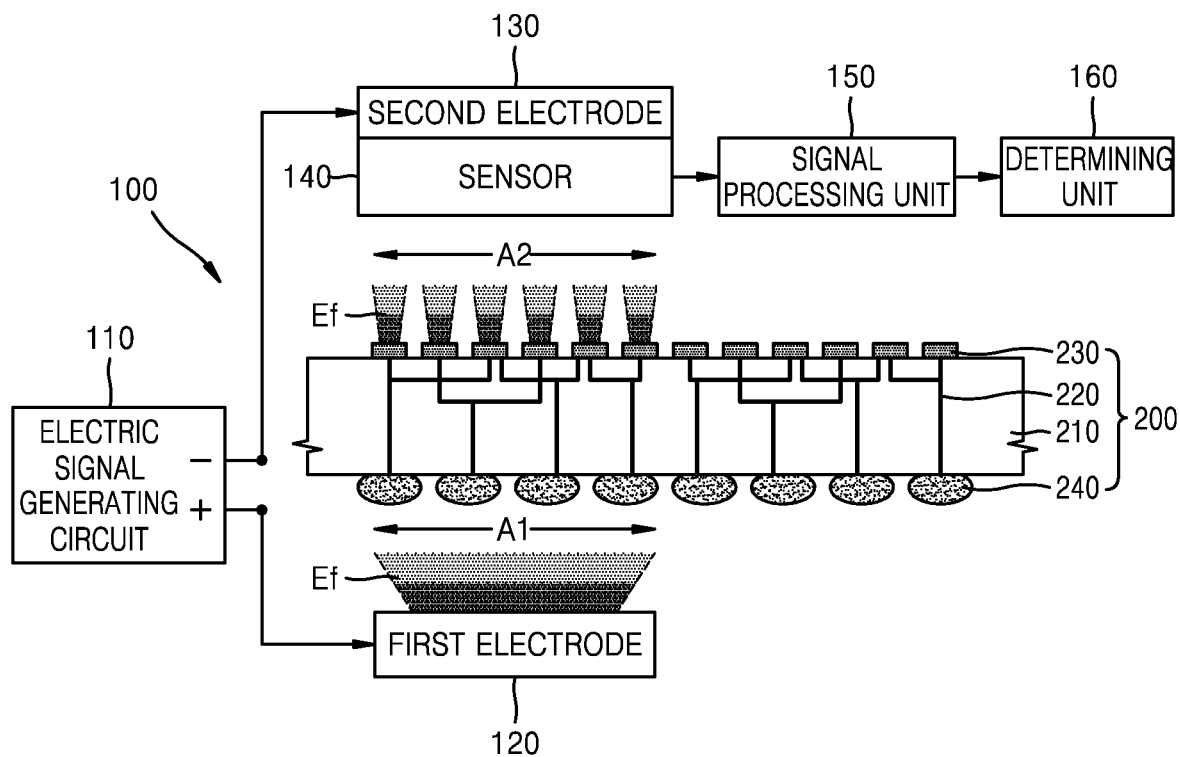
FIGS. 1A and 1B are block diagrams illustrating an interconnect circuit testing apparatus according to an exemplary embodiment of the inventive concept.
Figure 1B:
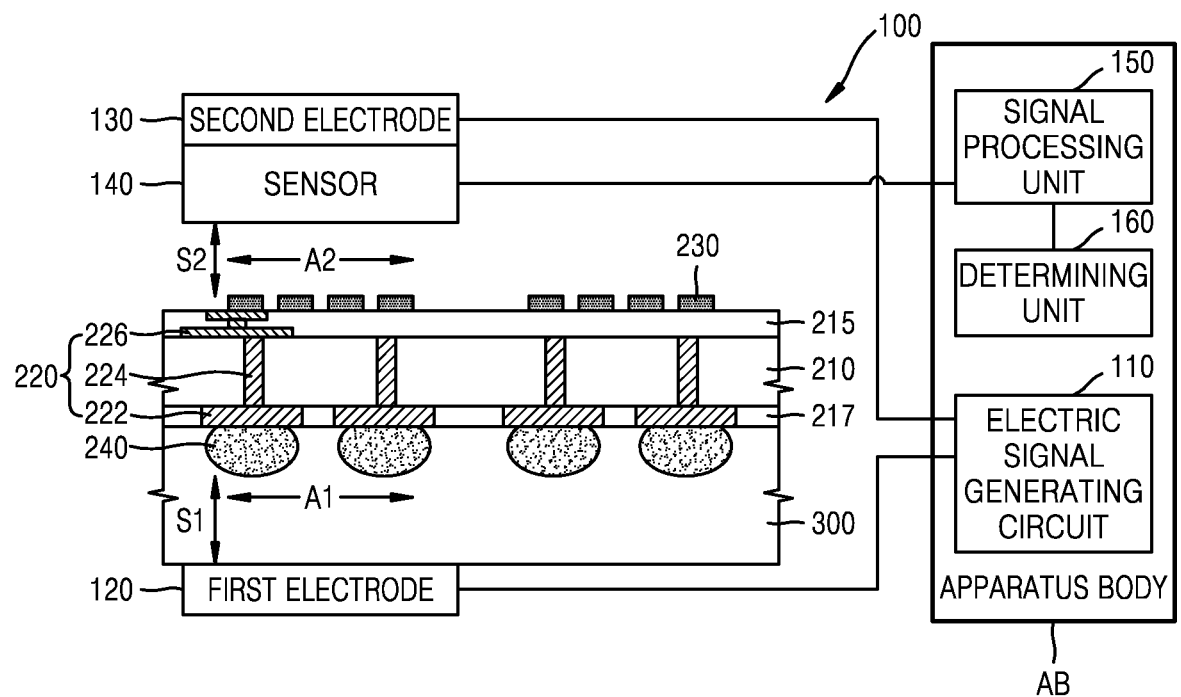

FIG. 1A is a block diagram of an interconnect circuit testing apparatus 100 according to an exemplary embodiment of the inventive concept and FIG. 1B is a block diagram illustrating an interconnect circuit board 200 in the interconnect circuit testing apparatus 100 of FIG. 1A in accordance with an exemplary embodiment of the inventive concept.

Referring to FIGS. 1A and 1B, the interconnect circuit testing apparatus 100 according to the current embodiment may test whether there is something wrong with an interconnect circuit of the interconnect circuit board 200 by using an electric field. The interconnect circuit testing apparatus 100 may include an electric signal generating circuit 110, a first electrode 120, a second electrode 130, a sensor 140, a signal processing unit 150, and a determining unit 160.

The electric signal generating circuit 110 may generate an electric field for generating an electric signal. For example, the electric signal generating circuit 110 generates an electric signal, and the electric signal is applied to the interconnect circuit board 200 through the first and second electrodes 120 and 130. This way, an electric field may be emitted from the interconnect circuit board 200. For example, the electric field is generated by a potential difference between the first and second electrodes 120 and 130, a shape of the electric field is changed by the interconnect circuit board 200 arranged between the first and second electrodes 120 and 130, and the electric field whose the shape is changed is emitted.

The electric signal generating circuit 110 may include an oscillator, a phase locked loop (PLL) circuit, and a digital-to-analog converter (DAC) and may generate a radio frequency (RF) signal as an electric signal. For example, the electric signal generating circuit 110 may generate an RF signal of dozens of MHz to dozens of GHz as the electric signal. A frequency range of the electric signal generated by the electric signal generating circuit 110 is not limited to dozens of MHz to dozens of GHz.

The first electrode 120 and the second electrode 130 are electrically connected to the electric signal generating circuit 110 and may apply the electric signal to the interconnect circuit board 200. The first electrode 120 and the second electrode 130 may be formed of a metal with high electrical conductivity. For example, the first electrode 120 and the second electrode 130 may include copper (Cu), aluminium (Al), nickel (Ni), silver (Ag), gold (Au), and platinum (Pt). According to an exemplary embodiment of the inventive concept, an electrode at a side where the electric field is detected between the first electrode 120 and the second electrode 130 may be formed of a transparent electrode such as an indium tin oxide (ITO) electrode.

Figure 2A:
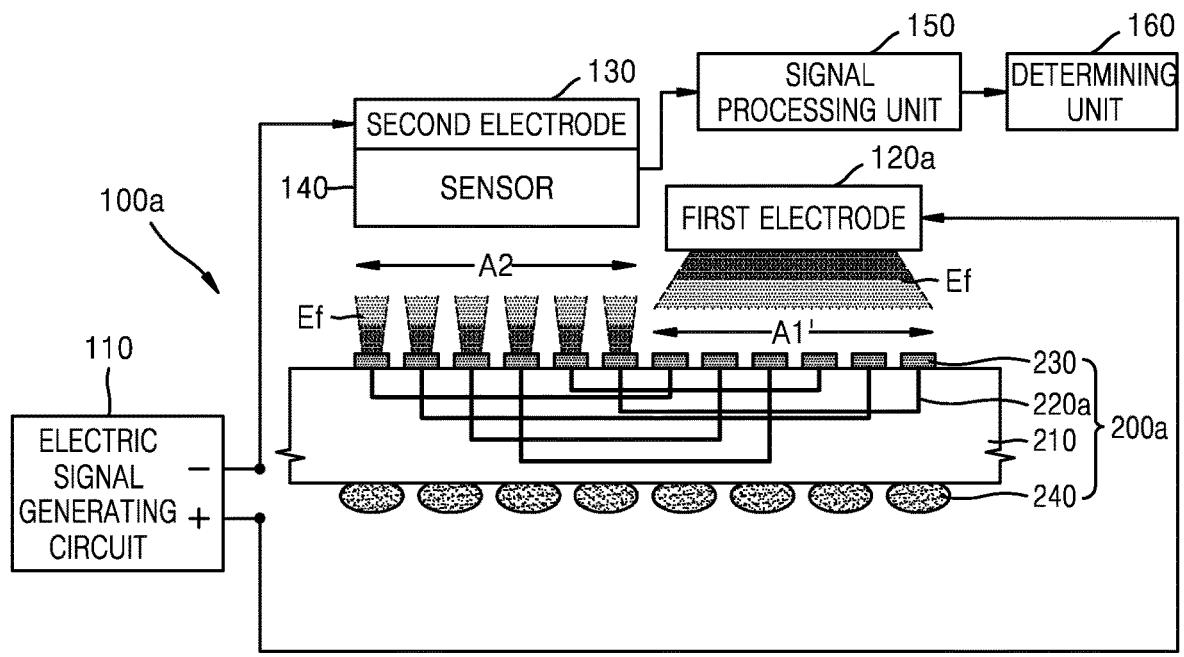
FIGS. 2A and 2B are block diagrams illustrating an interconnect circuit testing apparatus according to an exemplary embodiment of the inventive concept.

In the interconnect circuit testing apparatus 100 according to the current embodiment, the first electrode 120 is arranged under the interconnect circuit board 200 and the second electrode 130 may be arranged on or above the interconnect circuit board 200. Positions of the first electrode 120 and the second electrode 130 are not limited thereto. For example, as illustrated in FIG. 2A, both the first electrode 120 and the second electrode 130 may be arranged on or above the interconnect circuit board 200. In addition, both the first electrode 120 and the second electrode 130 may be arranged under the interconnect circuit board 200.

For reference, as illustrated in FIG. 1A, the first electrode 120 is connected to a positive electrode terminal (+) of the electric signal generating circuit 110 and the second electrode 130 is connected to a negative electrode terminal (−) of the electric signal generating circuit 110. Therefore, a direction of the electric field may be from the first electrode 120 to the second electrode 130. In other words, the direction of the electric field may be formed from the electrode that is connected to the positive electrode terminal (+) to the electrode that is connected to the negative electrode terminal (−). In addition, the terminals may be inversely connected so that the direction of the electric field may be from the second electrode 130 to the first electrode 120. In other words, the second electrode 130 may be connected to the positive electrode terminal (+) and the first electrode 120 may be connected to the negative electrode terminal (−). As a result, the first electrode 120 and the second electrode 130 may be distinguished based on the polarity applied thereto. In addition, since the polarity of an alternating current (AC) signal such as an analog signal has continuously changing polarity, there may be no distinction between the first electrode 120 and the second electrode 130 as pertains to the polarity. To form the electric field, a shape of an electrode adjacent to the sensor 140 may be controlled. In FIG. 1A, an electric field Ef is displayed through hatching. It is to be understood, however, that a shape of an actually emitted electric field Ef may vary.

The first electrode 120 and the second electrode 130 may be flat plate-shaped. For example, the first electrode 120 and the second electrode 130 may be flat plate-shaped to correspond to test regions of the interconnect circuit board 200.

For example, the first electrode 120 is flat plate-shaped to correspond to a first test area A1 in a lower surface of the interconnect circuit board 200 and the second electrode 130 may be flat plate-shaped to correspond to a second test region A2 in an upper surface of the interconnect circuit board 200. Here, the flat plate-shape may be circular, elliptical, or polygonal.

The first electrode 120 and the second electrode 130 may have the same shape or different shapes. In the interconnect circuit testing apparatus 100 according to the current embodiment, the first electrode 120 and the second electrode 130 may be square flat plate-shaped. However, the shapes of the first electrode 120 and the second electrode 130 are not limited to square flat plates. In addition, according to an exemplary embodiment of the inventive concept, the shapes of the first electrode 120 and the second electrode 130 are not limited to flat plates, for example, the first electrode 120 and the second electrode 130 may have other shapes. In the interconnect circuit testing apparatus 100 according to the current embodiment, the second electrode 130, which is adjacent to the sensor 140, is flat plate-shaped and may contribute to formation of the electric field, which will be described in more detail with reference to FIG. 9 below.

As illustrated in FIG. 1B, the first electrode 120 and the second electrode 130 may be separate from the interconnect circuit board 200. For example, the first electrode 120 may be separate from the lower surface of the interconnect circuit board 200 by a first distance S1, and the second electrode 130 may be separate from the upper surface of the interconnect circuit board 200 by a second distance S2. Here, the lower surface of the interconnect circuit board 200 may mean lower surfaces of connection terminals 240 and the upper surface of the interconnect circuit board 200 may mean upper surfaces of pads 230. In addition, the second distance S2 may be from the upper surface of the interconnect circuit board 200 to a lower surface of the second electrode 130. However, when the sensor 140 is combined with the second electrode 130, the second distance S2 may be from the upper surface of the interconnect circuit board 200 to a lower surface of the sensor 140.

Due to an insulating layer 300 arranged on the lower surface of the interconnect circuit board 200, the first distance S1 may be greater than the second distance S2. However, relative sizes of the first distance S1 and the second distance S2 are not limited thereto. For example, the first distance S1 and the second distance S2 may be equal to each other and the second distance S2 may be greater than the first distance S1. In addition, the first distance S1 and the second distance S2 may be controlled to distinguish the electric field emitted from the interconnect circuit board 200 by size and position. For example, as the first distance S1 and the second distance S2 decrease, the magnitude of the electric field may increase. In addition, distinction of the electric field by position, which is performed by the sensor 140, may become clear by controlling a position of the sensor 140 by the second distance S2.

The sensor 140 is arranged under an electrode at the side of the interconnect circuit board 200 where the electric field is detected. For example, the second electrode 130 and may detect the electric field emitted by the interconnect circuit board 200. The sensor 140 may be combined with the lower surface of the second electrode 130. However, the inventive concept is not limited thereto. The sensor 140 may be independent from the second electrode 130 by using a fixed structure. When the sensor 140 is independently arranged, the sensor 140 may contact the lower surface of the second electrode 130 or may be separate from the lower surface of the second electrode 130.

The sensor 140 may be, for example, a sensor using a current meter or a sensor using an electro-optic crystal. The sensor using the current meter and the sensor using the electro-optic crystal will be described in more detail with reference to FIGS. 10 to 13B below. A type of the sensor 140 is not limited to each of the above sensors. For example, any type of sensor that may detect the electric field may be applied to the interconnect circuit testing apparatus 100 according to the current embodiment.

Here, detection of the electric field by the sensor 140 may not be direct detection of the intensity of the electric field. Instead, the detection of the electric field by the sensor 140 may be detection of a signal or data indicative of the intensity of the electric field. For example, the sensor 140 may detect an electric signal or an optical signal such as current or light and information about the intensity of the electric field may be included in the detected electric signal or optical signal. Herein, the signal or data detected by the sensor 140 may be referred to as 'electric field'. However, the signal or data may be referred to as 'electric field data' when distinguishing electric field data from the intensity of the electric field.

The sensor 140 detects an electric field of an entire test region of the interconnect circuit board 200 at one time or an electric field of a part of the test region. When the sensor 140 detects the electric field of a part of the test region, the sensor 140 may detect the electric field of the rest of the test region by moving and scanning the test region. A shape and an electric field detecting method of the sensor 140 will be described in more detail with reference to FIGS. 4A and 4B below.

The signal processing unit 150 may calculate the intensity of the electric field with respect to a position of the interconnect circuit board 200. The signal processing unit 150 may also calculate a resistance value of an interconnect corresponding to the intensity of the electric field based on the electric field data detected by the sensor 140. For example, when pads on the upper surface of the interconnect circuit board 200 are arranged in the test region, the signal processing unit 150 may calculate the intensity of an electric field at each pad in the test region and a resistance value of an interconnect corresponding to the intensity of the electric field based on the detected electric field data.

The signal processing unit 150 may obtain electric field data from which noise is removed by filtering signals input from the sensor 140. In addition, the signal processing unit 150 may calculate the intensity of the electric field and the resistance value at particular positions of the interconnect circuit board 200 by applying a mathematical operation to the electric field data.

The determining unit 160 may determine whether the interconnect circuit of the interconnect circuit board 200 is normal. The determining unit 160 determines whether the interconnect circuit is normal based on design data of the interconnect circuit board 200 and the intensity of the electric field and the resistance value that are calculated by the signal processing unit 150. According to an exemplary embodiment of the inventive concept, the determining unit 160 may be included in the signal processing unit 150. The determining unit 160 for determining whether the interconnect circuit is normal will be described in more detail with reference to FIG. 8 below.

As noted from FIG. 1B, the electric signal generating circuit 110, the signal processing unit 150, and the determining unit 160 are combined with each other and may form an apparatus body AB. At least one of the electric signal generating circuit 110, the signal processing unit 150, and the determining unit 160 may be separate from the apparatus body AB. For example, the electric signal generating circuit 110 may form a first apparatus body and the signal processing unit 150 and the determining unit 160 may form a second apparatus body.

The interconnect circuit board 200 to be tested by the interconnect circuit testing apparatus 100 may include a substrate 210, an interconnect 220, pads 230, and connection terminals 240. The substrate 210 may include, for example, silicon, an organic material, plastic, or a glass substrate. The material of the substrate 210 is not limited to the above materials. The substrate 210 may have a single layer or multilayer structure. The interconnect circuit board 200 may be a silicon interposer when the substrate 210 is a silicon substrate. In addition, the interconnect circuit board 200 may be a panel interposer when the substrate 210 is an organic substrate.

The interconnect 220 may have a single layer or multi-layer interconnect depending on a structure of the substrate 210. For example, as noted from FIG. 1B, the interconnect 220 may include lower pads 222, through electrodes 224, and an interconnect layer 226. The through electrodes 224 pass through at least a part of the substrate 210 and may connect the lower pads 222 to the interconnect layer 226. When the substrate 210 is formed of silicon, the through electrodes 224 may be through silicon vias (TSVs). When the interconnect layer 226 is formed of two layers or more, different layers of the interconnect layer 226 may be connected through a vertical contact. In addition, the lower pads 222 may be covered with a lower insulating layer 217 and the interconnect layer 226 may be covered with an interlayer insulating layer 215.

The pads 230 are arranged on an upper surface of the substrate 210 and may be electrically connected to the interconnect 220. Then, semiconductor chips such as memory chips or logic chips may be stacked on the pads 230 through fine bumps.

The connection terminals 240 are arranged on a lower surface of the substrate 210 and may be electrically connected to the interconnect 220. The connection terminals 240 may be used when the interconnect circuit board 200 is stacked on a package board such as a printed circuit board (PCB). The connection terminals 240 may be bumps or solder balls depending on a shape or material thereof. The connection terminals 240 may be arranged on the lower pads 222. For example, the connection terminals 240 may be connected to the pads 230 through the interconnect 220. Among the pads 230, pads used for power or ground are united and are connected to the connection terminals 240 so that the number of pads 230 may be greater than the number of connection terminals 240.

As illustrated in FIG. 1B, the insulating layer 300 may be arranged under the interconnect circuit board 200. The insulating layer 300 may be, for example, a carrier substrate or a supporting substrate. For example, in a process performed on the interconnect circuit board 200 or a process of stacking semiconductor chips on the interconnect circuit board 200, the thin interconnect circuit board 200 may not separately handled with ease. Therefore, a carrier substrate of a thickness of several hundreds to several thousands of μm is attached to a rear surface of the interconnect circuit board 200, in other words, a surface on which the connection terminals 240 are arranged, before performing the process on the interconnect circuit board 200 or the process of stacking the semiconductor chips. In FIG. 1B, an adhesive layer is integrated with the insulating layer 300. Therefore, the connection terminals 240 may be positioned in the adhesive layer. The insulating layer 300 may be removed after the process of stacking the semiconductor chips.

When the insulating layer 300 is arranged on the lower surface of the interconnect circuit board 200, in a conventional contact-type testing method, since a test pin may not contact the connection terminals 240, resistance between the pads 230 and the connection terminals 240 may not be measured. Therefore, the interconnect circuit board 200 may not be tested by the conventional contact-type testing method. In addition, in the conventional contact-type testing method, since the test pin directly contacts the pads 230 and the connection terminals 240, the pads 230 and the connection terminals 240 may be damaged, and thus, the quality of a semiconductor device may deteriorate. Furthermore, in the conventional contact-type testing method, automatic test equipment (ATE) may be used, which is time consuming. As a consequence, it is disadvantageous in terms of return on investment (ROI) to test an interconnect circuit board 200 with a high-priced ATE for a long time.

On the other hand, since a method of applying an electric signal between the first and second electrodes 120 and 130 and generating and detecting the electric field is used in the interconnect circuit testing apparatus 100 according to the current embodiment, the first and second electrodes 120 and 130 do not have to directly contact the pads 230 and the connection terminals 240 of the interconnect circuit board 200. In other words, the interconnect circuit test apparatus 100 according to the current embodiment may test the interconnect circuit board 200 by a non-contact method. Therefore, the interconnect circuit testing apparatus 100 according to the current embodiment may test the interconnect circuit board 200 regardless of the presence of the insulating layer 300. In addition, in the interconnect circuit testing apparatus 100 according to the current embodiment, since the first and second electrodes 120 and 130 do not directly contact the pads 230 and the connection terminals 240, the pads 230 and the connection terminals 240 may not be damaged. In other words, the interconnect circuit testing apparatus 100 according to the current embodiment may non-destructively test the interconnect circuit board 200. Furthermore, the interconnect circuit testing apparatus 100 according to the current embodiment may test the interconnect circuit board 200 at a high speed with basic components. Therefore, inefficiencies associated with the use of the conventional contact-type ATE test may be cured.

In addition, the interconnect circuit testing apparatus 100 according to the current embodiment performs the non contact-type test. However, a contact-type test is not excluded. For example, since the electric field is generated while the first electrode 120 directly contacts the connection terminals 240, the interconnect circuit board 200 may be tested by using the electric field in the contact method. The contact and/or non contact-type test of the first and second electrodes 120 and 130 will be described in more detail with reference to FIGS. 5A to 6D below.

The interconnect circuit testing apparatus 100 according to the current embodiment is described based on the above interconnect circuit board 200 to be tested. However, an object to be tested by the interconnect circuit testing apparatus 100 according to the current embodiment is not limited to the above interconnect circuit board 200. For example, any type of semiconductor apparatus in which a re-interconnect and/or interconnect is included and pads and/or connection terminals are arranged on at least one of an upper surface and a lower surface of the apparatus may be tested by the interconnect circuit testing apparatus 100 according to the current embodiment. In addition, the interconnect circuit testing apparatus 100 according to the current embodiment may be used for wafer testing equipment, package testing equipment, or defect analysing equipment.

Figure 2B:
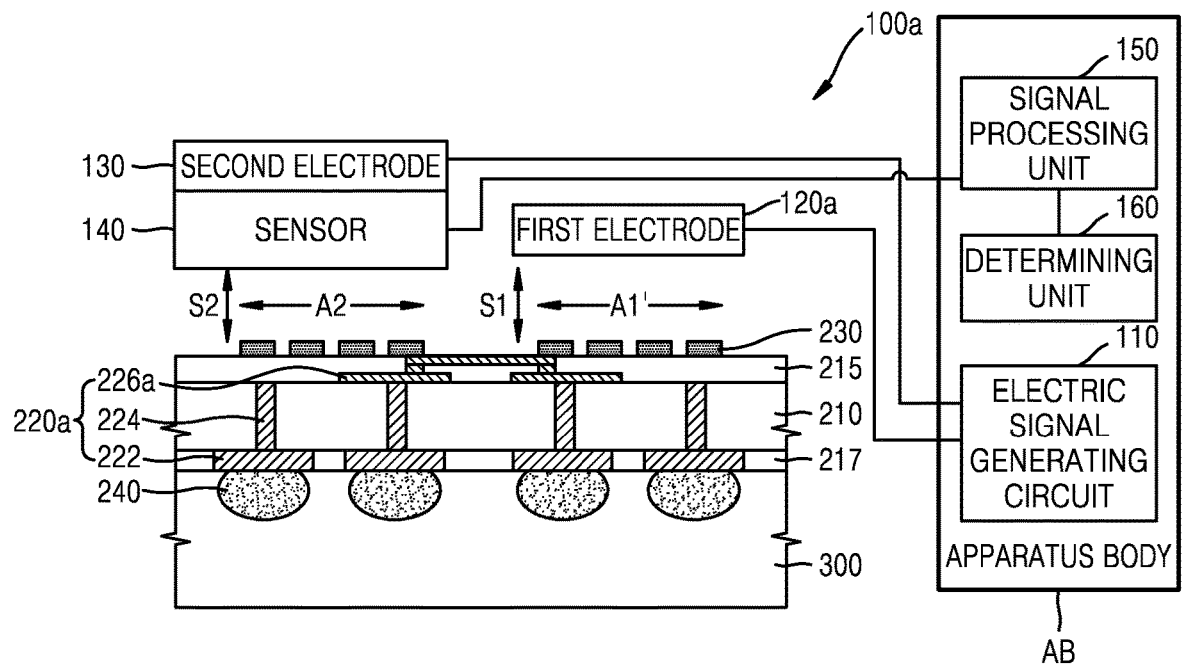

FIG. 2A is a block diagram of an interconnect circuit testing apparatus 100a according to an exemplary embodiment of the inventive concept. FIG. 2B is a block diagram illustrating an interconnect circuit board in the interconnect circuit testing apparatus 100a of FIG. 2A in accordance with an exemplary embodiment of the inventive concept. Descriptions previously provided with reference to FIGS. 1A and 1B are briefly provided or omitted.

Referring to FIGS. 2A and 2B, the interconnect circuit testing apparatus 100a according to the current embodiment may be different from the interconnect circuit testing apparatus 100 of FIG. 1A in that a first electrode 120a is arranged on or above an interconnect circuit board 200a. In other words, the first electrode 120a and the second electrode 130 may be arranged on the same surface of the interconnect circuit board 200a.

As illustrated in FIG. 2A, in the interconnect circuit board 200a, the pads 230 of a first test region A1' in which the first electrode 120a is arranged and the pads 230 of a second test region A2 in which the second electrode 130 is arranged may be electrically connected through an interconnect 220a. When the pads 230 are electrically connected through the interconnect 220a, the first electrode 120a and the second electrode 130 are arranged on the same side of the interconnect circuit board 200a and a test may be performed. In FIG. 2A, for convenience, an electric field Ef is displayed through hatching. However, a shape of the actually emitted electric field Ef may vary.

For reference, in a region in which there is metal, the electric field may be in the same direction as current. Therefore, in FIG. 1A, the electric field may be formed along the interconnect 220 in a direction from the connection terminals 240 and the pads 230. For example, the electric field may be formed along a vertical direction. In addition, in FIG. 2A, the electric field may be formed along the interconnect 220a in a direction from the pads 230 of the first test region A1' to the pads 230 of the second test region A2. For example, the electric field may be formed along a horizontal direction. On the other hand, in a region in which there is no metal, there exists only the electric field, since current may not flow. Therefore, the electric field may only be between the pads 230 of the second test region A2 and the second electrode 130. On the other hand, a shape of the electric field from the pads 230 of the second test region A2 to the second electrode 130 may vary in accordance with shapes of the interconnects 220 and 220a. For example, the intensity of the electric field from the pads 230 to the second electrode 130 with no cut off section in a path of the interconnects 220 and 220a may be greater than the intensity of the electric field from the pads 230 to the second electrode 130 with a cut off section in the path of the interconnects 220 and 220a.

In FIG. 2B, only one of the pads 230 of the first test region A1' is connected to only one of the pads 230 of the second test region A2 through an interconnect layer 226a. This illustration is for convenience, since as illustrated in FIG. 2A, all of the pads 230 of the first test region A1' may be connected to all of the pads 230 of the second test region A2. On the other hand, in the interconnect circuit testing apparatus 100a according to the current embodiment, since both the first and second electrodes 120a and 130 are arranged on the interconnect circuit board 200a, the insulating layer 300 may not affect the test. Therefore, the test may be performed so that the first electrode 120a contacts the pads 230 of the first test region A1' of the interconnect circuit board 200a.

Figure 3:
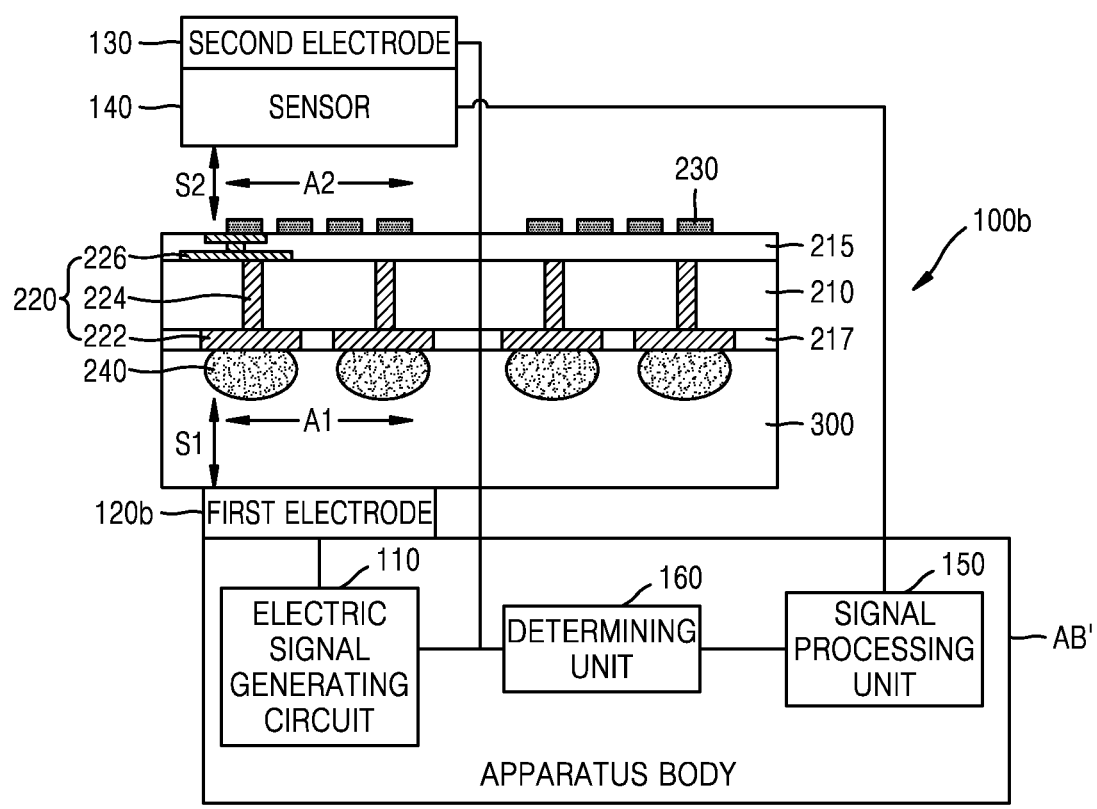
FIG. 3 is a block diagram of an interconnect circuit testing apparatus according to an exemplary embodiment of the inventive concept.

FIG. 3 is a block diagram of an interconnect circuit testing apparatus 100b according to an exemplary embodiment of the inventive concept. Descriptions previously provided with reference to FIGS. 1A to 2B are briefly provided or omitted.

Referring to FIG. 3, the interconnect circuit testing apparatus 100b may be different from the interconnect circuit testing apparatus 100 of FIG. 1B in that the first electrode 120b forms a part of an apparatus body AB'. For example, in the interconnect circuit testing apparatus 100b according to the current embodiment, since the first electrode 120b forms a part of the apparatus body AB', the apparatus body AB' may include an electric signal generating circuit 110, the first electrode 120b, the signal processing unit 150, and the determining unit 160. Therefore, the first electrode 120b may be considered as being combined with the electric signal generating circuit 110. In addition, when the electric signal generating circuit 110 forms a separate first apparatus body, the first electrode 120b and the electric signal generating circuit 110 may be combined with each other to form the first apparatus body.

In the interconnect circuit testing apparatus 100b according to the current embodiment, since the first electrode 120b forms a part of the apparatus body AB', the apparatus body AB' may be arranged under the interconnect circuit board 200 so that the first electrode 120b may cover the first test region A1 of the interconnect circuit board 200. In addition, as illustrated in FIG. 3, since the electric field is generated by applying the electric signal, the first electrode 120b may be arranged outside the apparatus body AB'.

On the other hand, the second electrode 130 may form a part of the apparatus body AB', even though the second electrode 130 is arranged at the sensor 140 side of the interconnect circuit board 200.

Figure 4A:
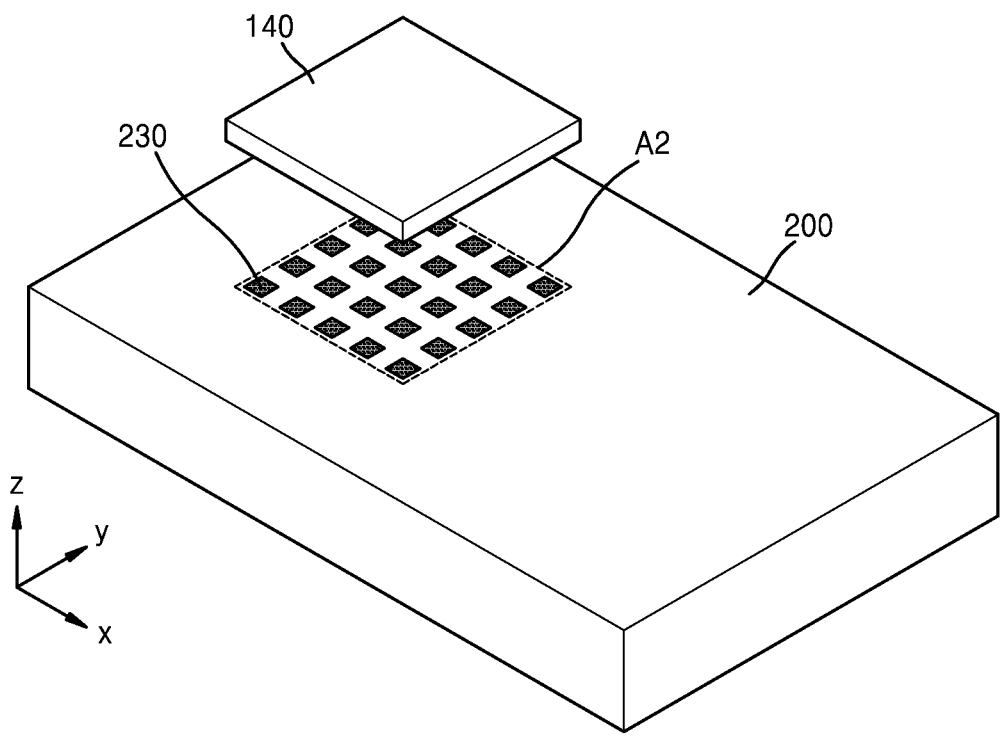
FIGS. 4A and 4B are perspective views illustrating a sensor unit in the interconnect circuit testing apparatus of FIG. 1A in accordance with an exemplary embodiment of the inventive concept.
Figure 4B:
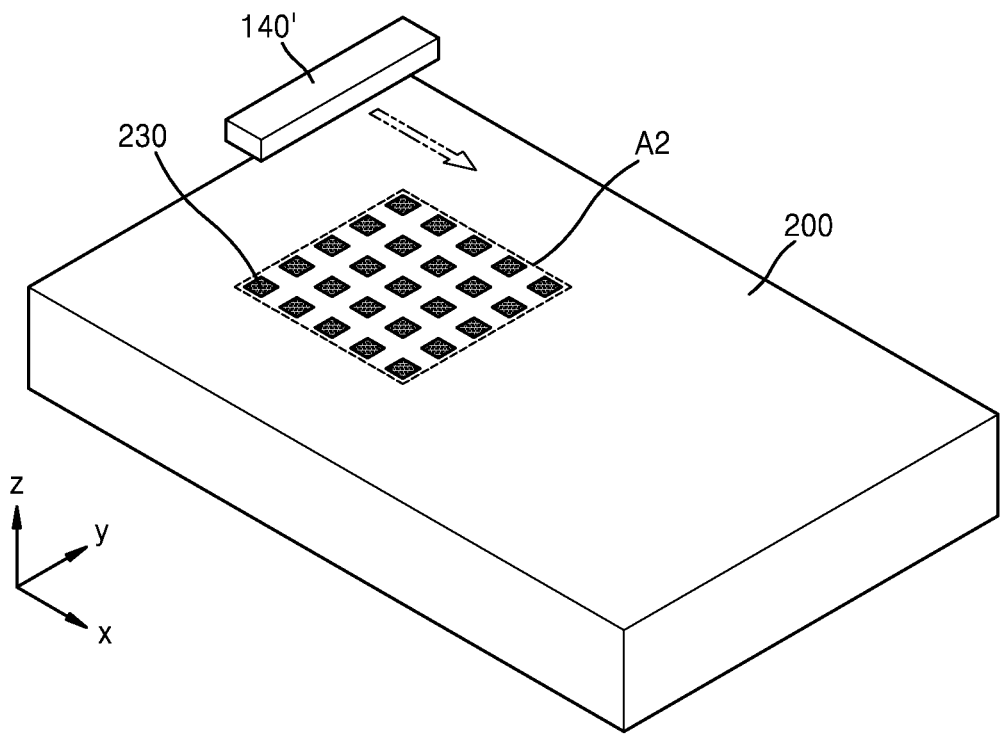

FIGS. 4A and 4B are perspective views illustrating a sensor in the interconnect circuit testing apparatus of FIG. 1A in accordance with an exemplary embodiment of the inventive concept. Descriptions previously provided with reference to FIGS. 1A and 1B are briefly provided or omitted.

Referring to FIG. 4A, in the interconnect circuit testing apparatus 100 according to the current embodiment, the sensor 140 may be flat plate-shaped to correspond to the second test region A2 of the interconnect circuit board 200. For example, when the second test region A2 is square, the sensor 140 may be square flat plate-shaped to correspond to the shape of the second test region A2.

The sensor 140 may be the sensor using the current meter or the sensor using the electro-optic crystal as described above. When the sensor 140 is the sensor using the current meter, a lower surface of the current meter on which antennas are arranged may be flat plate-shaped. In addition, when the sensor 140 is the sensor using the electro-optic crystal, the electro-optic crystal may be flat plate-shaped.

In the interconnect circuit testing apparatus 100 according to the current embodiment, the flat plate-shaped sensor 140 may be wider than the second test region A2. Therefore, the sensor 140 may cover the entire second test region A2 and may detect the electric field of the entire second test region A2 of the interconnect circuit board 200 at one time.

Referring to FIG. 4B, in the interconnect circuit testing apparatus 100 according to the current embodiment, a sensor 140' may be flat plate-shaped to be long in one direction. For example, the sensor 140' may be flat plate-shaped, but extending lengthwise in a second direction (e.g., a y direction). The sensor 140' may not cover the entire square-shaped second test region A2. However, the sensor 140' may be greater than a width in the second direction (e.g., the y direction) of the second test region A2. Based on the shape of the sensor 140', the sensor 140' may detect the electric field of part of the second test region A2. However, the sensor 140' may detect the electric field of the entire second test region A2 by scanning for the electric field while moving in a first direction (e.g., an x direction) as marked with an arrow in FIG. 4B.

On the other hand, the sensor 140' may be flat plate-shaped to extend lengthwise in the first direction (e.g., the x direction) and may detect the electric field of the entire second test region A2 by scanning for the electric field in the second direction (e.g., the y direction). In addition, the sensor 140' may detect the electric field of the entire second test region A2 by using other various flat plate shapes and scan directions.

Figure 5A:
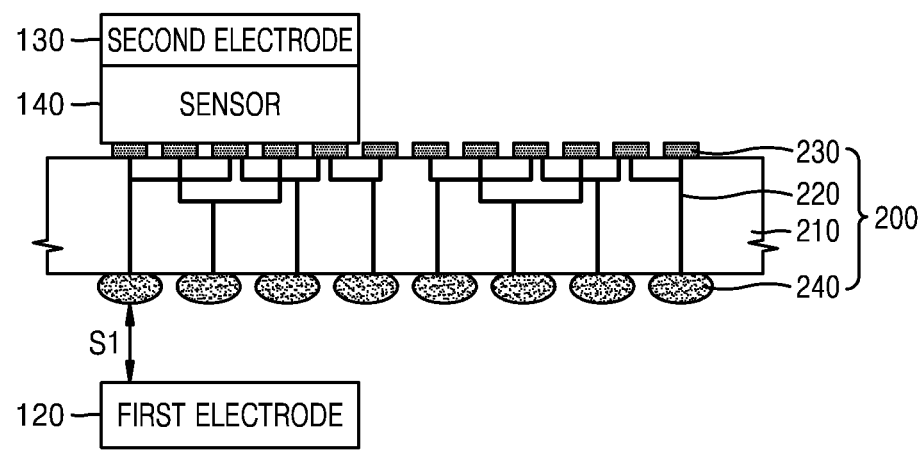
FIGS. 5A, 5B and 5C are cross-sectional views illustrating a position relationship among electrodes, a sensor, and an interconnect circuit board in the interconnect circuit testing apparatus of FIG. 1A in accordance with an exemplary embodiment of the inventive concept.
Figure 5B:
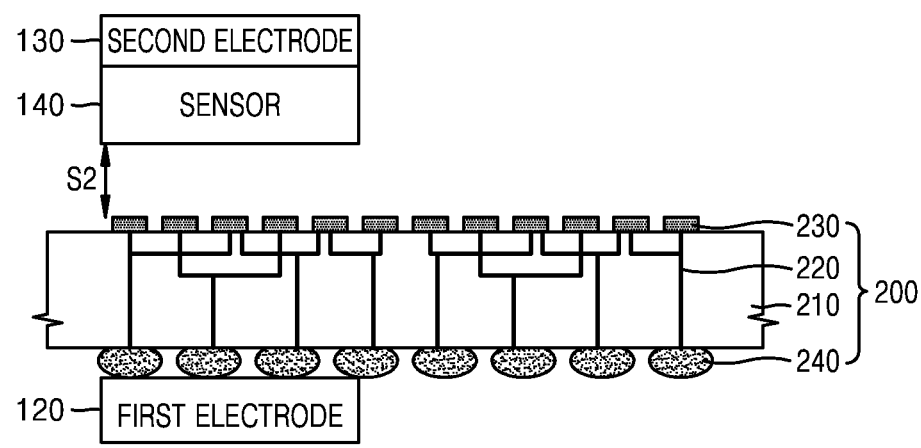
Figure 5C:
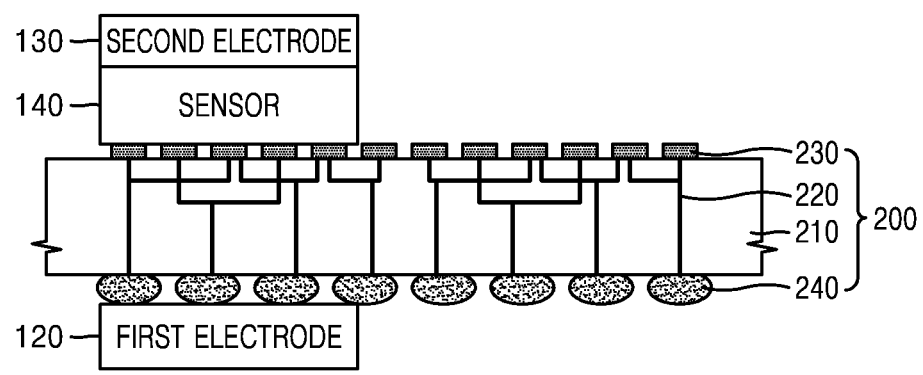

FIGS. 5A to 5C are cross-sectional views illustrating a position relationship among electrodes, a sensor, and an interconnect circuit board in the interconnect circuit testing apparatus of FIG. 1A. In FIGS. 5A to 5C, an electric signal generating circuit, a signal processing unit, and a determining unit are not shown. Descriptions previously provided with reference to FIGS. 1A and 1B are briefly provided or omitted.

Referring to FIG. 5A, in the interconnect circuit testing apparatus 100 according to the current embodiment, the sensor 140 may be arranged to contact the pads 230 of the second test region A2 of the interconnect circuit board 200. For example, when the sensor 140 is the sensor using the current meter, antennas may contact the pads 230 of the second test region A2. In addition, when the sensor 140 is the sensor using the electro-optic crystal, the electro-optic crystal may contact the pads 230 of the second test region A2. On the other hand, the first electrode 120 may be separate from the lower surface of the interconnect circuit board 200, in other words, the first test region A1, by the first distance S1 like in the interconnect circuit testing apparatus 100 of FIG. 1B.

Referring to FIG. 5B, in the interconnect circuit testing apparatus 100 according to the current embodiment, the first electrode 120 may be arranged to contact the connection terminals 240 of the first test region A1 of the interconnect circuit board 200. In addition, when the sensor 140 is combined with the first electrode 120, the second electrode 130 may contact the pads 230 of the second test region A2 of the interconnect circuit board 200.

Referring to FIG. 5C, in the interconnect circuit testing apparatus 100 according to the current embodiment, the first electrode 120 contacts the connection terminals 240 of the first test region A1 of the interconnect circuit board 200 and the sensor 140 may contact the pads 230 of the second test region A2 of the interconnect circuit board 200. In addition, when the sensor 140 is arranged at the side of the first electrode 120, the second electrode 130 contacts the pads 230 of the second test region A2 of the interconnect circuit board 200 and the sensor 140 may contact the connection terminals 240 of the first test region A1 of the interconnect circuit board 200.

FIGS. 6A to 6D are cross-sectional views illustrating a position relationship among electrodes, a sensor, and an interconnect circuit board in the interconnect circuit testing apparatus of FIG. 2A. In FIGS. 6A to 6D, an electric signal generating circuit, a signal processing unit, and a determining unit are not shown. Descriptions previously provided with reference to FIGS. 2A and 2B are briefly provided or omitted.

Figure 6A:
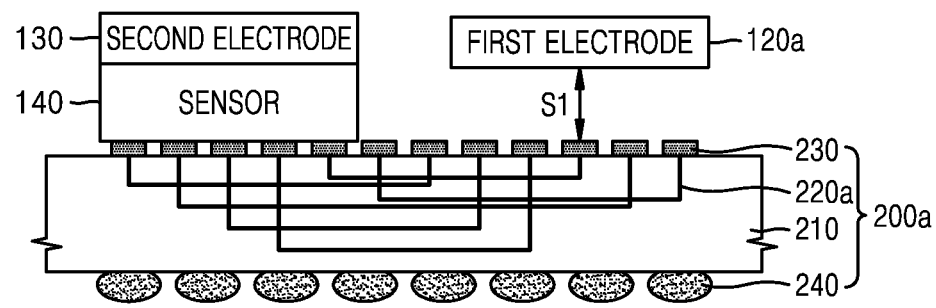
FIGS. 6A, 6B, 6C and 6D are cross-sectional views illustrating a position relationship among electrodes, a sensor, and an interconnect circuit board in the interconnect circuit testing apparatus of FIG. 2A in accordance with an exemplary embodiment of the inventive concept.

Referring to FIG. 6A, in the interconnect circuit testing apparatus 100a according to the current embodiment, the sensor 140 may be arranged to contact the pads 230 of the second test region A2 of the interconnect circuit board 200a. On the other hand, the first electrode 120a may be separate from the upper surface of the interconnect circuit board 200a, in other words, the first test region A1', by the first distance S1 like in the interconnect circuit testing apparatus 100 of FIG. 2B.

Figure 6B:
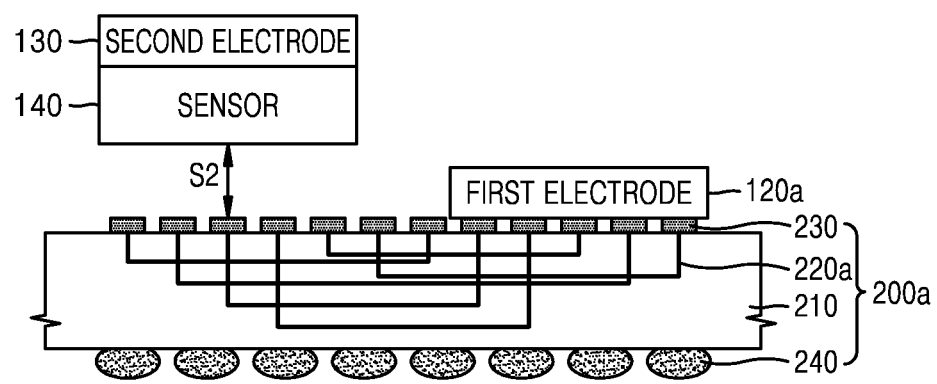

Referring to FIG. 6B, in the interconnect circuit testing apparatus 100a according to the current embodiment, the first electrode 120a may be arranged to contact the pads 230 of the first test region A1' of the interconnect circuit board 200a. In addition, when the sensor 140 is combined with the first electrode 120a, the second electrode 130 may contact the pads 230 of the second test region A2 of the interconnect circuit board 200a.

Figure 6C:
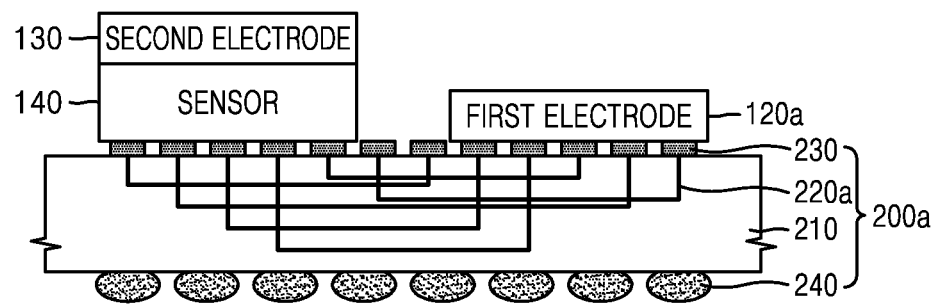

Referring to FIG. 6C, in the interconnect circuit testing apparatus 100a according to the current embodiment, the first electrode 120a contacts the pads 230 of the first test region A1' of the interconnect circuit board 200a and the sensor 140 may contact the pads 230 of the second test region A2 of the interconnect circuit board 200a. In addition, when the sensor 140 is combined with the first electrode 120a, the second electrode 130 contacts the pads 230 of the second test region A2 of the interconnect circuit board 200 and the sensor 140 may contact the pads 230 of the first test region A1' of the interconnect circuit board 200a.

Figure 6D:
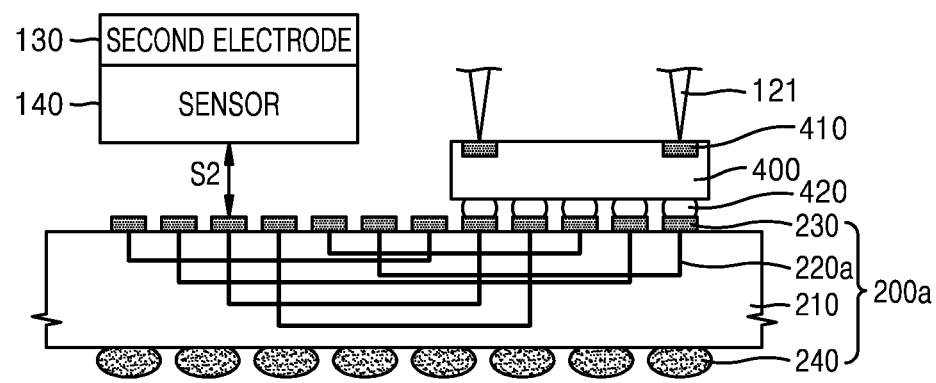

Referring to FIG. 6D, in the interconnect circuit testing apparatus 100a according to the current embodiment, a semiconductor chip 400 stacked on the interconnect circuit board 200a may function as the first electrode. In other words, when the semiconductor chip 400 is stacked on the interconnect circuit board 200a through fine bumps 420 and an electric signal is applied by using the semiconductor chip 400, the semiconductor chip 400 may function as the first electrode. For example, chip pads 410 of the semiconductor chip 400 may contact test pins 121 connected to a terminal of the electric signal generating circuit (refer to 110 of FIG. 1A). In this case, the electric signal is applied to the chip pads 410 of the semiconductor chip 400 through the test pins 121 and be applied to the pads 230 of the interconnect circuit board 200a through the fine bumps 420. Therefore, the electric signal is applied between the semiconductor chip 400 and the second electrode 130 so that the electric field is emitted from the interconnect circuit board 200a, and thus, the sensor 140 may detect the electric field.

In FIG. 6D, only one semiconductor chip 400 is stacked on the interconnect circuit board 200a. However, when a plurality of semiconductor chips are stacked on the interconnect circuit board 200a, all the stacked semiconductor chips may function as the first electrode. In addition, an electric device electrically connected to the pads 230 of the interconnect circuit board 200a may function as the first electrode. Furthermore, without the semiconductor chip or the electric device interposed, the test pins 121 may function as the first electrode. In such a case, although the test pin 121 has a different shape from the first electrode 120a shown in FIG. 6B, the test pin 121 may have the same function as the first electrode 120a.

Figure 7:
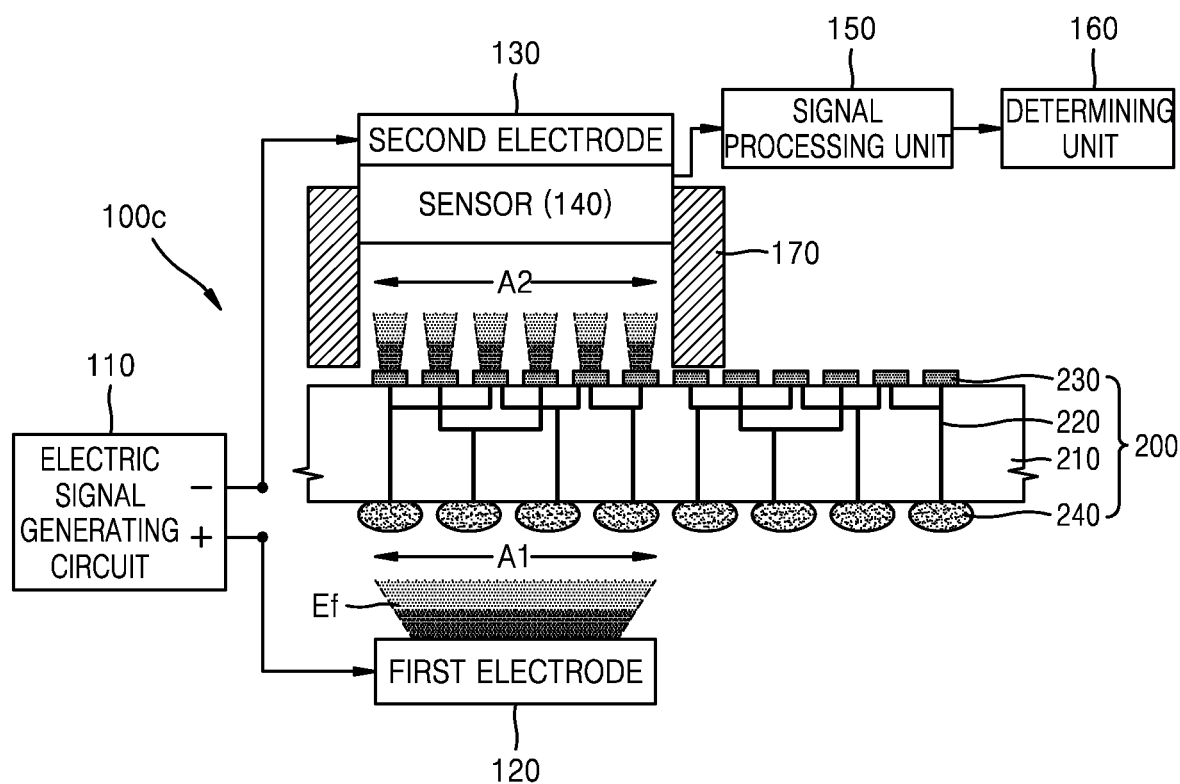
FIG. 7 is a block diagram of an interconnect circuit testing apparatus according to an exemplary embodiment of the inventive concept.

FIG. 7 is a block diagram of an interconnect circuit testing apparatus 100c according to an exemplary embodiment of the inventive concept. Descriptions previously provided with reference to FIGS. 1A and 1B will be simply described or description hereof will not be given.

Referring to FIG. 7, the interconnect circuit testing apparatus 100c according to the current embodiment may be different from the interconnect circuit testing apparatus 100 of FIG. 1A in that electric field blocking structures 170 are further provided. For example, in the interconnect circuit testing apparatus 100c according to the current embodiment, the electric field blocking structures 170 may be arranged at sides of the sensor 140 to surround the second test region A2. The electric field blocking structures 170 may extend from the sides of the sensor 140 downward. Lower surfaces of the electric field blocking structures 170 may be separate from the interconnect circuit board 200 or may contact the interconnect circuit board 200. When the lower surfaces of the electric field blocking structures 170 contact the interconnect circuit board 200, the electric field blocking structures 170 may contact the insulating layer of the interconnect circuit board 200.

The electric field blocking structure 170 may prevent an external electric field from entering the second test region A2. Therefore, the electric field blocking structures 170 may be formed of metal capable of blocking an electric field. In FIG. 7, the electric field blocking structures 170 are combined with the sides of the sensor 140. However, a structure of the electric field blocking structures 170 is not limited thereto. For example, the electric field blocking structures 170 may be separate from the sensor 140 and not combined with the sensor 140. In addition, the electric field blocking structures 170 may be combined with the sides of the second electrode 130. Since the electric field blocking structures 170 and the second electrode 130 are electrically insulated from each other, upper parts of the electric field blocking structures 170 combined with the second electrode 130 may be formed of insulating layers.

The interconnect circuit testing apparatus 100c according to the current embodiment may further include the electric field blocking structures 170 on the second test region A2 in which the electric field is detected so that the external electric field is prevented from entering the second test region A2. Thus, only the electric field emitted from the interconnect circuit board 200 exists in the second test region A2. Therefore, the sensor 140 may correctly detect the electric field of the second test region A2 and reliability of the test for the interconnect circuit board 200 may increase.

Figure 8:
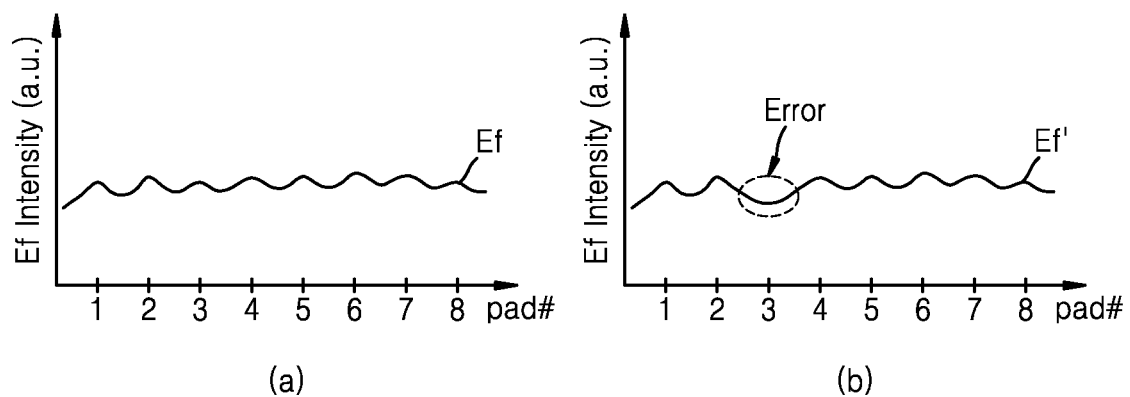
FIG. 8 illustrates graphs for describing testing an interconnect circuit by using the interconnect circuit testing apparatus of FIG. 1A in accordance with an exemplary embodiment of the inventive concept.

FIG. 8 illustrates graphs for describing testing an interconnect circuit by using the interconnect circuit testing apparatus of FIG. 1A in accordance with an exemplary embodiment of the inventive concept. The graph (a) illustrates the electric field when the interconnect circuit board is normal and the graph (b) illustrates the electric field when the interconnect circuit board is abnormal. Here, an x axis represents numbers of the pads arranged in one direction, a y axis represents intensity of the detected electric field, and a unit is an arbitrary unit. For convenience, the interconnect circuit testing apparatus of FIG. 1A will be described together with FIG. 8.

Referring to FIG. 8, when the interconnect circuit board 200 is normal, each of the pads may emit the electric field applied through a corresponding interconnect to the outside. Therefore, as noted from the graph (a), the intensity of the electric field Ef may be high in a position corresponding to each of the pads and may be low in a position corresponding to each interval between the pads. The graph (a) illustrates a case in which structures of interconnects of the pads are the same. When the structures of the interconnects of the pads are different from each other, a graph of another shape may be generated.

In the graph (b), as an error is marked with a dotted circle. For example, the error is marked with the intensity of an electric field Ef' is low in a position corresponding to a third pad. When the electric field Ef' is low, although the pad exists, it may be assumed that a part of the interconnect connected to the pad is cut off. Therefore, the corresponding interconnect circuit board 200 is in an abnormal state, since a part of the interconnect is cut off.

Testing processes performed by the interconnect circuit testing apparatus 100 according to the current embodiment are as follows. First, an electric field graph with respect to a normal interconnect circuit board such as the graph (a) is selected as a reference electric field graph. Then, the electric field is detected from the interconnect circuit board being tested and a test electric field graph is obtained. Then, the reference electric field graph and the test electric field graph are compared to determine whether the tested interconnect circuit board is normal.

For example, the reference electric field graph with respect to the normal interconnect circuit board may be selected by a following method. First, when the interconnect circuit board is to be directly tested by the contact method, the interconnect circuit board is directly tested. When the interconnect circuit board is determined to be normal, the electric field is detected from the corresponding interconnect circuit board by using the interconnect circuit testing apparatus 100 and the electric field graph is obtained. The electric field graph may be selected as the reference electric field graph. Next, as illustrated in FIG. 1B, when the interconnect circuit board is not directly tested by the contact method, the electric field is detected by using the interconnect circuit testing apparatus 100 according to the current embodiment and the electric field graph is obtained. Then, subsequent processes are performed on the corresponding interconnect circuit board and a direct test is performed when the direct test may be performed by the contact method. When it is determined that the corresponding interconnect circuit board is normal, the previously obtained electric field graph may be selected as the reference electric field graph.

Figure 9:
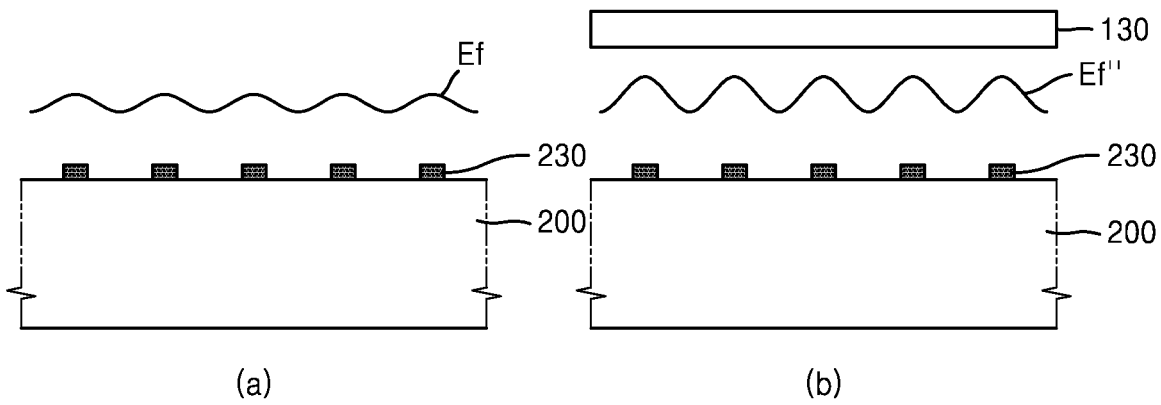
FIG. 9 is a cross-sectional view describing forming an electric field by using a flat plate-shaped upper electrode in the interconnect circuit testing apparatus of FIG. 1A in accordance with an exemplary embodiment of the inventive concept.

FIG. 9 is a view describing forming an electric field by using a flat plate-shaped upper electrode in the interconnect circuit testing apparatus of FIG. 1A in accordance with an exemplary embodiment of the inventive concept. For convenience, the interconnect circuit testing apparatus of FIG. 1A will be described together with FIG. 9.

Referring to FIG. 9, (a) of FIG. 9 illustrates that the electric field is applied to the interconnect circuit board 200 and an additional electrode is not arranged on the interconnect circuit board 200. Still referring to FIG. 9, (b) of FIG. 9 illustrates that the electric field is applied to the interconnect circuit board 200 and the flat plate-shaped second electrode 130 is arranged on the interconnect circuit board 200.

In addition, the electric field may be applied to the lower surface of the interconnect circuit board 200 by using the first electrode 120 as illustrated in FIG. 1A. As illustrated in FIG. 2A, the electric field may be applied to the upper surface of the interconnect circuit board 200 by using the first electrode 120. In addition, the electric field may be directly applied to the interconnect circuit board 200 by directly contacting test pins to the pads 230 or the connection terminals 240.

As noted from (a) and (b) of FIG. 9, when the electric field is applied to the interconnect circuit board 200, intensities of electric fields Ef and Ef" are high in positions corresponding to the pads 230 and low in positions corresponding to intervals between the pads 230. In addition, a shape of the electric field when the flat plate-shaped second electrode 130 is arranged on the interconnect circuit board 200 may be different from a shape of the electric field when the flat plate-shaped second electrode 130 is not arranged on the interconnect circuit board 200.

For example, when the second electrode 130 does not exist, as illustrated in (a) of FIG. 9, a difference between the intensity of the electric field Ef in each of the areas corresponding to the pads 230 and the intensity of the electric field Ef in each of the areas corresponding to the intervals between the pads 230 may not be large. Therefore, a shape of the emitted electric field may be a soft curvature in which a difference in position between a ridge and a valley is small.

On the other hand, when the flat plate-shaped second electrode 130 exists, as illustrated in (b) of FIG. 9, a difference between the intensity of the electric field Ef" in each of the areas corresponding to the pads 230 and the intensity of the electric field Ef" in each of the areas corresponding to the intervals between the pads 230 may be large. This is so, because the second electrode 130 increases a potential difference so that the intensity of the electric field in each of the areas corresponding to the pads 230 increases. As a result, a shape of the emitted electric field may be a sharp curvature in which a difference in position between a ridge and a valley is large.

Due to the flat plate-shaped second electrode 130, the intensities of the electric fields in the areas corresponding to the pads 230 uniformly and sharply increase. Therefore, it is easy to distinguish the electric fields corresponding to the pads 230 from each other. In addition, in a comparison and determination process, it is easy to determine which pad is abnormal. As a result, the flat plate-shaped second electrode 130 forms the shape of the electric field Ef" so that the electric fields may be easily distinguished by their positions, in other words, pad locations. However, when the second electrode 130 is not flat plate-shaped, to correspond to the shape of the second electrode 130, the electric field is focused toward the second electrode 130. Therefore, the electric fields corresponding to the pads may not be easily distinguished.

Figure 10:
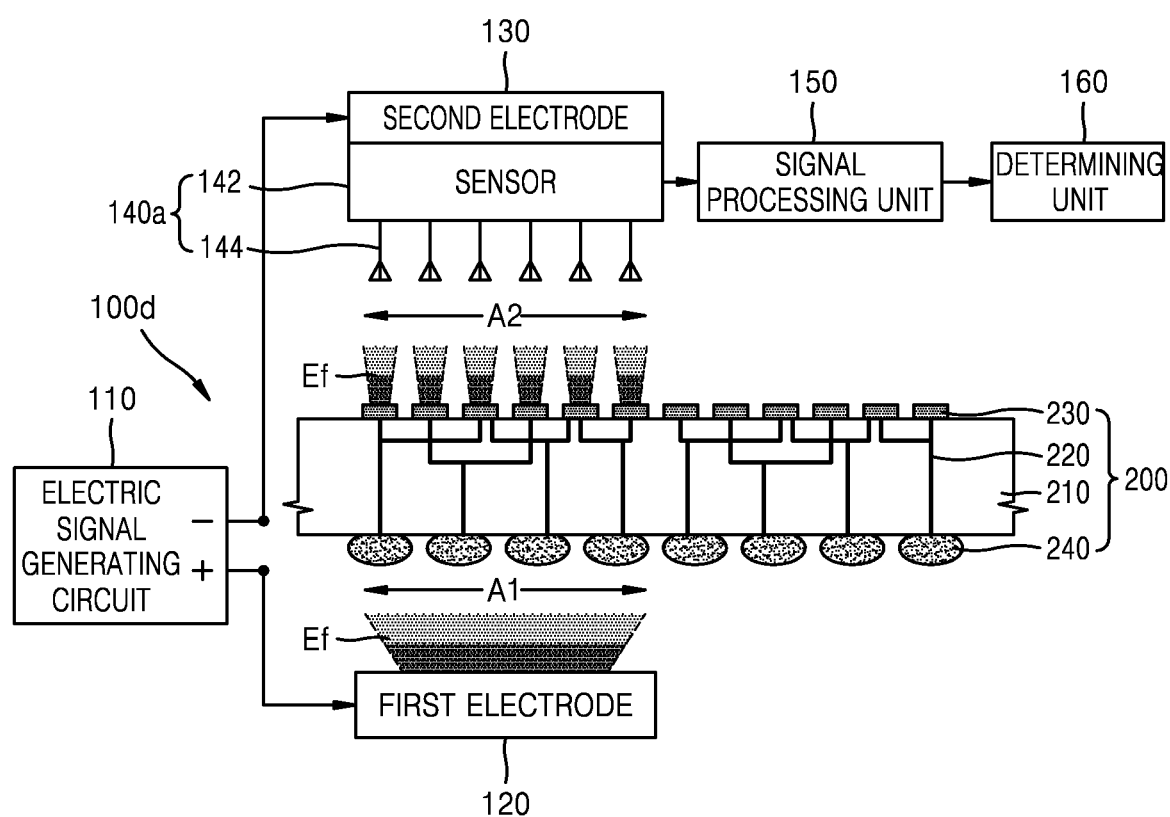
FIGS. 10, 11 and 12 are block diagrams of interconnect circuit testing apparatuses according to exemplary embodiments of the inventive concept.
Figure 11:
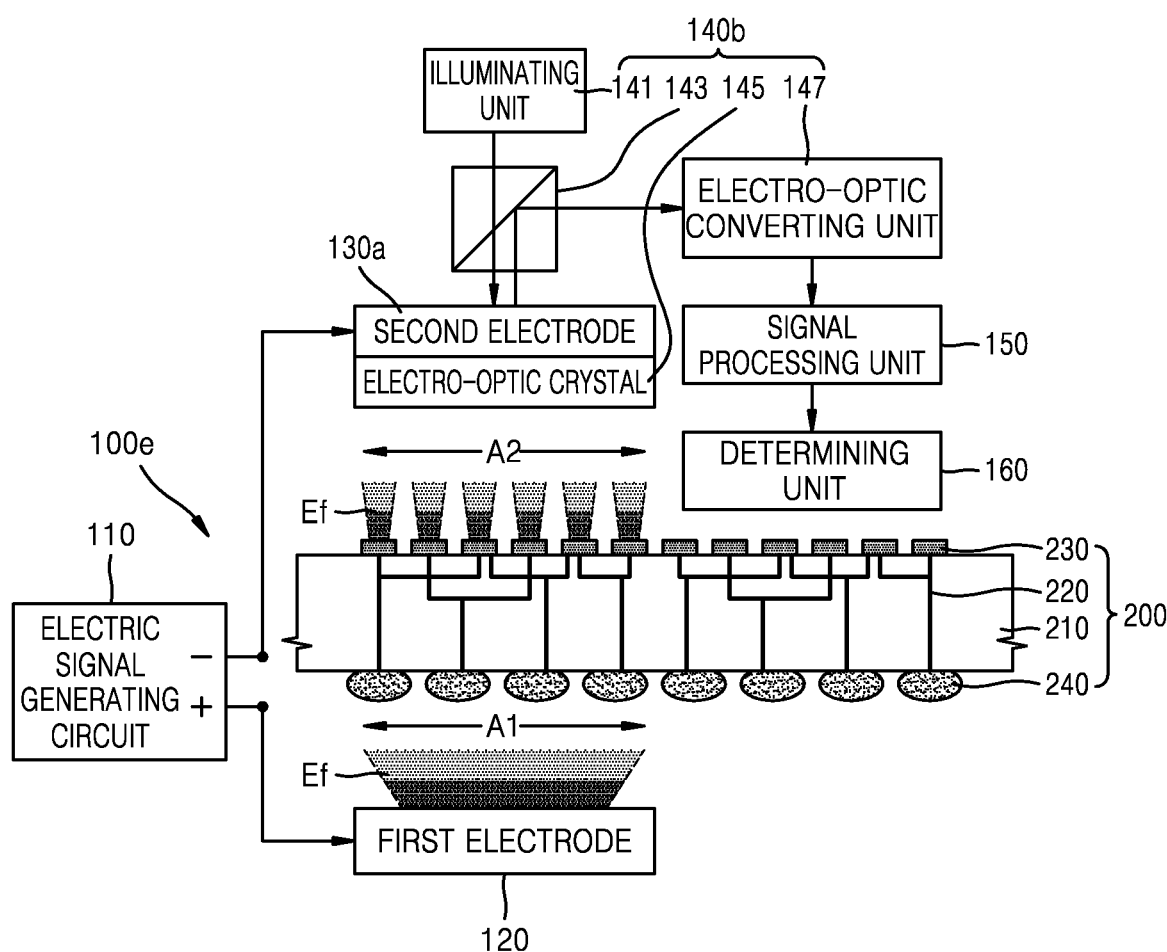
Figure 12:
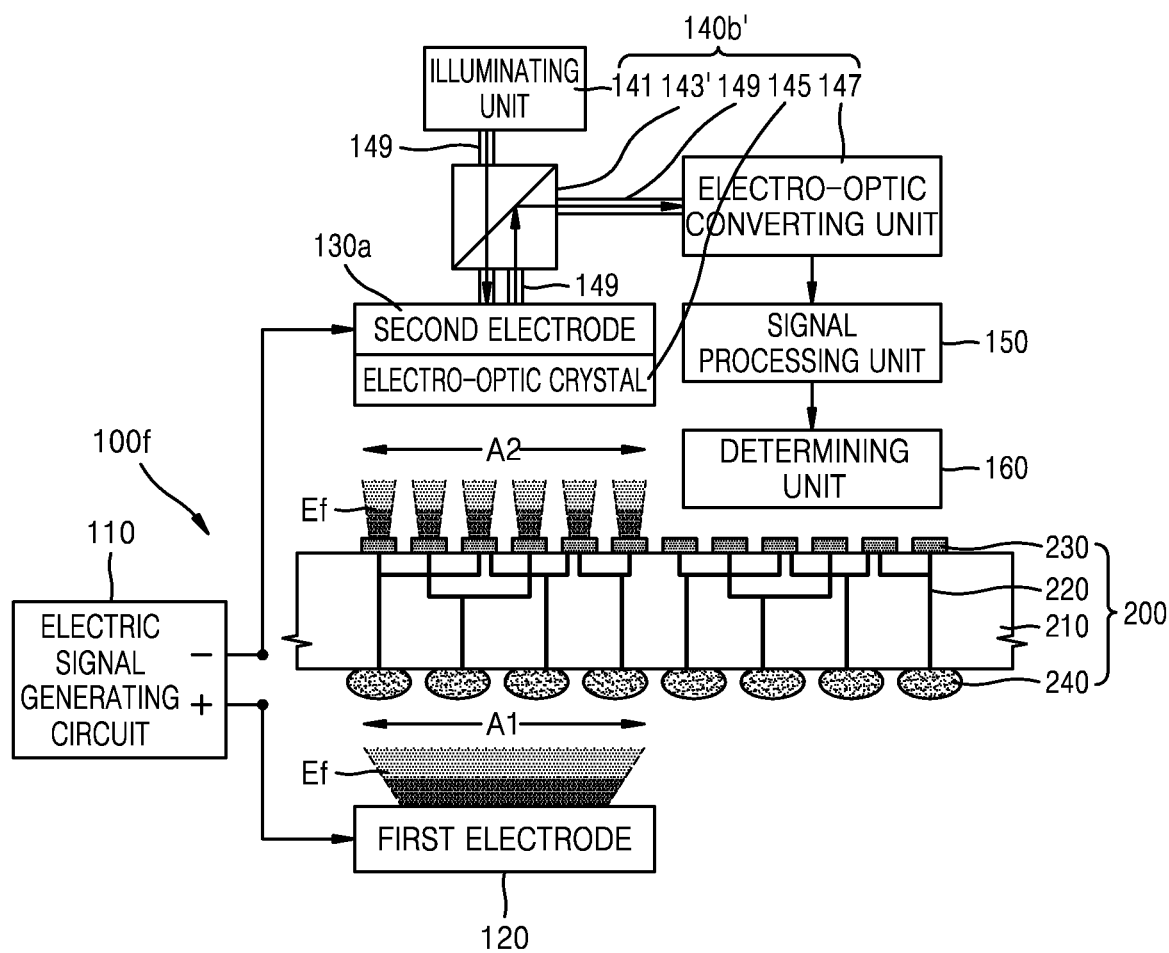

FIGS. 10 to 12 are block diagrams of interconnect circuit testing apparatuses 100d, 100e, and 100f according to exemplary embodiments of the inventive concept. Descriptions previously provided with reference to FIGS. 1A and 1B are briefly provided or omitted.

Referring to FIG. 10, in the interconnect circuit testing apparatus 100d according to the current embodiment, a sensor 140a may use a current meter 142. For example, the sensor 140a may include the current meter 142 and antennas 144. For example, a plurality of the antennas 144 may be arranged on a lower surface of the current meter 142 to correspond to the pads 230 and the electric field emitted from the pads 230 may be received through the antennas 144. The current meter 142 may measure the current that flows through the antennas 144 in response to the received electric field. The sensor 140a may detect the electric field in parallel by using the antennas 144 corresponding to the plurality of pads 230.

Each of various types of antennas 144 may be applied to the sensor 140a using the current meter 142. For example, the antennas 144 may be a linear antenna such as a monopole antenna, a minute loop antenna, a helical antenna, or a meandering antenna, a plane or patch type antenna such as a plane inverse F antenna, a microstrip antenna, a compound antenna such as a folded antenna, a dielectric antenna, or a magnetic antenna. In the interconnect circuit testing apparatus 100d according to the current embodiment, the sensor 140a may include a patch type antenna.

Referring to FIG. 11, in the interconnect circuit testing apparatus 100e according to the current embodiment, a sensor 140b may use an electro-optic crystal 145. For example, the sensor 140b may include an illuminating unit 141, an optical device 143, the electro-optic crystal 145, and an electro-optic converter or electro-optic converting unit 147.

The illuminating unit 141 generates light and may have the light incident on the optical device 143. The optical device 143 transmits or reflects light from the illuminating unit 141, has the light incident on the electro-optic crystal 145, reflects or transmits light reflected from the electro-optic crystal 145, and may have the light incident on the electro-optic converter 147. The illuminating unit 141 may be, for example, a beam splitter.

The electro-optic crystal 145 includes a reflecting plate on a lower surface thereof and may reflect incident light. In addition, a refractive index of the electro-optic crystal 145 may change or, in the electro-optic crystal 145, a direction of crystals may change in accordance with the intensity of the electric field. Therefore, a reflection characteristic of light may vary in accordance with the intensity of the electric field. The electro-optic crystal 145 will be described in more detail with reference to FIGS. 13A and 13B below. The electro-optic converter 147 may convert the light input from the optical device 143 into an electric signal. Here, the electric signal may correspond to 'electric field data' including information on the intensity of the electric field.

Since a second electrode 130a is arranged between the optical device 143 and the electro-optic crystal 145 and the light is to be incident on the electro-optic crystal 145, the second electrode 130a may be a transparent electrode such as an indium tin oxide (ITO) electrode. However, the material of the second electrode 130a is not limited thereto.

The interconnect circuit testing apparatus 100e according to the current embodiment may include an optical device that spreads light so that the light may be irradiated onto the entire electro-optic crystal 145 corresponding to the second test region A2. In addition, when the second test region A2 is large so that the light may not be irradiated all at once, the light may be irradiated onto the electro-optic crystal 145 by performing a scan. In addition, the interconnect circuit testing apparatus 100e according to the current embodiment may include a beam homogenizer so that the light may be irradiated onto the electro-optical crystal 145 with uniform intensity.

In the interconnect circuit testing apparatus 100e according to the current embodiment, a technique of detecting the electric field will be described. The refractive index of the electro-optic crystal 145 may change or, in the electro-optic crystal 145, the direction of the crystals may change in accordance with the intensity of the electric field emitted from the pads 230. In addition, the reflection characteristic of the light may vary in accordance with the refractive index or the direction of the crystals. Therefore, data about the intensity of the electric field may be obtained by receiving and analyzing the light reflected from the electro-optic crystal 145.

Referring to FIG. 12, the interconnect circuit testing apparatus 100f according to the current embodiment may be similar to the interconnect circuit testing apparatus 100e of FIG. 11, except that in FIG. 12 a sensor 140b' uses an optical fiber 149. For example, in the interconnect circuit testing apparatus 100f according to the current embodiment, the sensor 140b' may further include the optical fiber 149 for limiting a movement path of the light and blocking external noise light. In other words, the illuminating unit 141 and an optical device 143', the optical device 143' and the electro-optic crystal 145 or the second electrode 130a, and the optical device 143' and the electro-optic converter 147 are connected through the optical fiber 149. Therefore, light may be transmitted among these elements through the optical fiber 149.

In addition, the optical device 143' may be formed of a beam splitter or an optic circulator. In addition, like in the interconnect circuit testing apparatus 100e of FIG. 11, the second electrode 130a may be a transparent electrode.

Figure 13A:
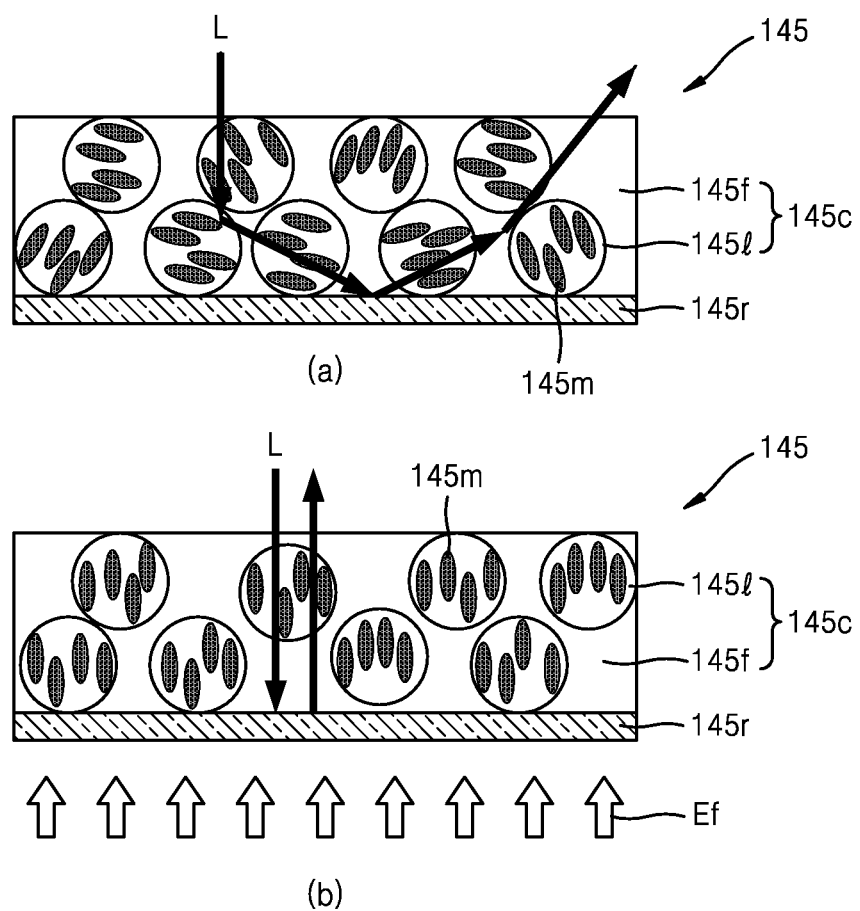
FIGS. 13A and 13B are cross-sectional views illustrating an electro-optic crystal in the interconnect circuit testing apparatus of FIG. 11 in accordance with an exemplary embodiment of the inventive concept.
Figure 13B:
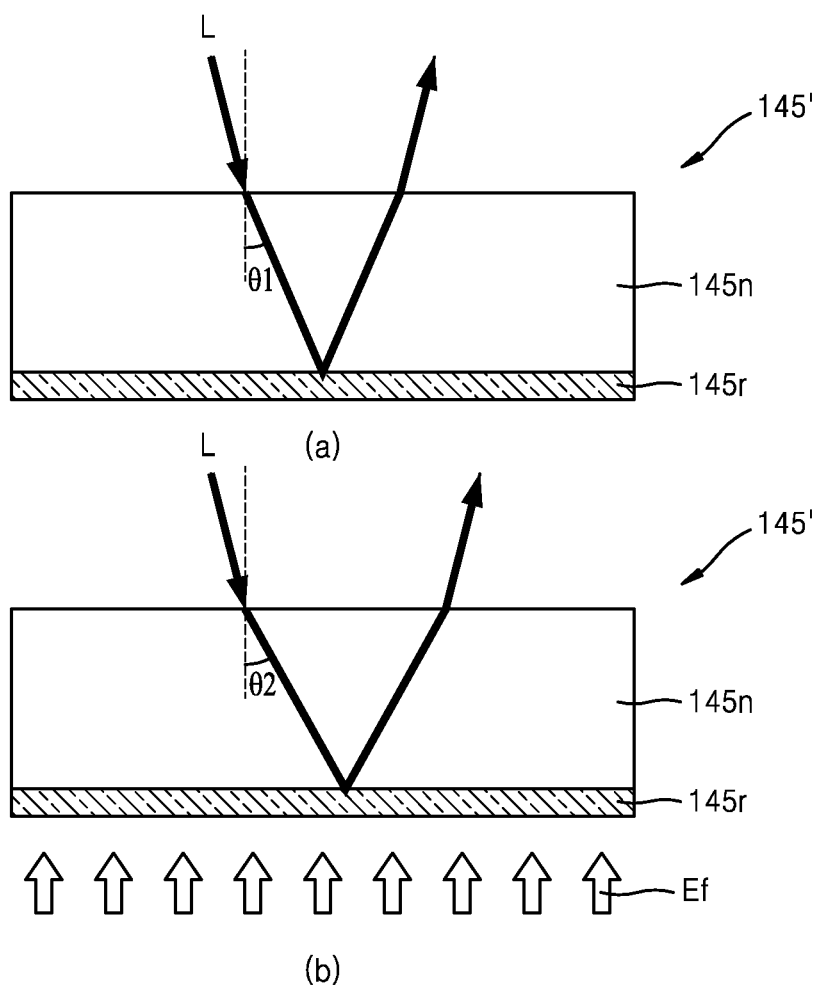

FIGS. 13A and 13B are cross-sectional views illustrating an electro-optic crystal in the interconnect circuit testing apparatus of FIG. 11 in accordance with an exemplary embodiment of the inventive concept.

Referring to FIG. 13A, the electro-optic crystal 145 may include a reflecting plate 145r and a compound material layer 145c. The reflecting plate 145r may reflect incident light. The reflecting plate 145r may be formed of a dielectric mirror film or cholesteric liquid crystal (CLC) polymer.

The compound material layer 145c may include a polymer film 145f and liquid crystal droplets 145l. For example, the compound material layer 145c may be polymer dispersed liquid crystal (PDLC). Therefore, the compound material layer 145c may have a structure in which the plurality of liquid crystal droplets 145l are dispersed in the polymer film 145f. In each of the liquid crystal droplets 145l, a plurality of liquid crystal molecules 145m may be provided.

As illustrated in (a) of FIG. 13A, in a state in which the electric field Ef is not applied, the liquid crystal molecules 145m in the liquid crystal droplets 145l may be randomly arranged. Due, however, to a characteristic of liquid crystal, the liquid crystal molecules 145m are not completely randomly arranged but may have a certain degree of regularity. Therefore, incident light L is scattered by the randomly arranged liquid crystal molecules 145m so that the compound material layer 145c may look opaque. In (a) of FIG. 13A, it is illustrated that the incident light L reaches the reflecting plate 145r. However, some of the incident light L may not reach the reflecting plate 145r.

In a state in which the electric field Ef is applied as illustrated in (b) of FIG. 13A, the liquid crystal molecules 145m in the liquid crystal droplets 145l may be aligned in the direction of the electric field Ef. Therefore, the incident light L passes through the aligned liquid crystal molecules 145m, reaches the reflecting plate 145r, and is reflected by the reflecting plate 145r so that the compound material layer 145c may look transparent.

In (b) of FIG. 13A, it is illustrated that the electric field Ef is applied to the entire region so that all the liquid crystal molecules 145m are aligned in the direction of the electric field Ef. However, the electric field may not be applied to the entire region. In such a case, the liquid crystal molecules 145m with low intensity of the electric field may be incompletely aligned in the direction of the electric field Ef so that a reflection characteristic, in other words, a reflectance of the area receiving a low amount of the electric field Ef, may be reduced.

As a result, the interconnect circuit testing apparatuses 100e and 100f of FIG. 11 or 12 detect light by reflectance in accordance with the intensity of the electric field, convert the detected light into an electric signal, and calculate the intensity of the electric field of the corresponding position by using the electro-optic characteristic of the electro-optic crystal 145.

Referring to FIG. 13B, an electro-optic crystal 145' may include the reflecting plate 145r and a refractive index converting layer 145n. The reflecting plate 145r is the same as the reflecting plate 145r of the electro-optic crystal 145 of FIG. 13A.

A refractive index of the refractive index converting layer 145n may change by applying the electric field. A change in refractive index may change a refraction angle of incident light. In addition, the change in the refractive index may change a phase of light. The refractive index converting layer 145n may be formed of, single crystal silicon. However, a material of the refractive index converting layer 145n is not limited to single crystal silicon.

As illustrated in (a) of FIG. 13B, in a state in which the electric field Ef is not applied, the incident light L is refracted at a first refraction angle θ1 at a boundary of the refractive index converting layer 145n. The incident light L is then reflected by the reflecting plate 145r, and emitted. As illustrated in (b) of FIG. 13B, in a state in which the electric field Ef is applied, the refractive index of the refractive index converting layer 145n changes. Therefore, the incident light L is refracted at a second refraction angle θ2 at a boundary of the refractive index converting layer 145n. The incident light L is then reflected by the reflecting plate 145r, and emitted. Therefore, with respect to the incident light made incident at a set incident angle, the emitted light is detected at a set angle and the detected light is converted into an electric signal so that the intensity or presence of the electric field Ef of the corresponding position may be detected.

In addition, as described above, a change in the refractive index may change the phase of the light. Therefore, the light is made to be vertically incident on the refractive index converting layer 145n and a change in phase is calculated with respect to the emitted light so that the presence or intensity of the electric field Ef of the corresponding position may be detected.

Figure 14:
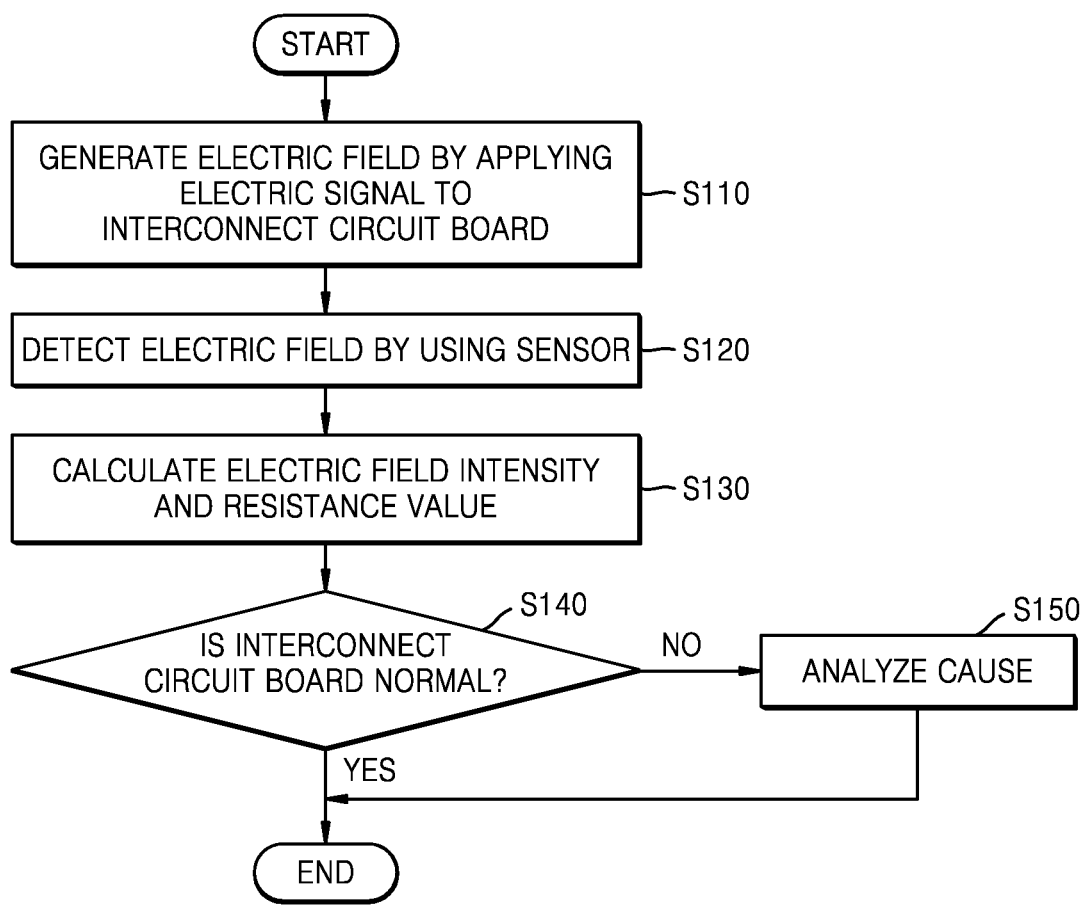
FIG. 14 is a flowchart illustrating an interconnect circuit testing method according to an exemplary embodiment of the inventive concept.

FIG. 14 is a flowchart illustrating an interconnect circuit testing method according to an exemplary embodiment of the inventive concept. For convenience, the interconnect circuit testing apparatus of FIGS. 1A and 1B will be described together with FIG. 14.

Referring to FIG. 14, first, the electric field is generated by applying the electric signal to the interconnect circuit board 200 by using the first and second electrodes 120 and 130 in operation S110. The interconnect circuit board 200 may include a substrate 210, an interconnect 220, the pads 230, and the connection terminals 240. As the electric signal is applied, the electric field may be emitted from the second test region A2 in which the second electrode 130 is arranged. The first electrode 120 and the second electrode 130 may be respectively arranged above the upper surface of the interconnect circuit board 200 and the lower surface of the interconnect circuit board 200 like in the interconnect circuit testing apparatus 100 of FIG. 1A. However, the inventive concept is not limited thereto. For example, like in the interconnect circuit testing apparatus 100a of FIG. 2A, the first and second electrodes 120a and 130 may be arranged together above the upper surface of the interconnect circuit board 200a or below the lower surface of the interconnect circuit board 200a.

In addition, although the interconnect circuit board 200 is described as an example, the interconnect circuit testing method according to the current embodiment can be applied to other devices. For example, any type of semiconductor apparatuses in which a re-interconnect and/or interconnect is included and pads and/or connection terminals are arranged on at least one of an upper surface and a lower surface may be tested by the interconnect circuit testing method according to the current embodiment. In addition, the interconnect circuit testing method according to the current embodiment may be used for wafer testing equipment and package testing equipment.

After forming the electric field, the electric field is detected by using the sensor 140 in operation S120. The sensor 140 uses the current meter or the electro-optic crystal and may be arranged between the second electrode 130 and the interconnect circuit board 200. The operation of generating the electric field S110 and the operation of detecting the electric field S120 are distinguished from each other. However, due to an electro-magnetic characteristic of the electric field, generation and detection of the electric field may be almost simultaneously performed. In addition, the electric field detected by the sensor 140 may be 'electric field data' including information on the intensity of the electric field.

After detecting the electric field, the intensity of the electric field of the interconnect circuit board 200 near each of the pads 230 and a resistance value of the interconnect corresponding to the intensity of the electric field are calculated in operation S130. The intensity of the electric field and the resistance value may be calculated by the signal processing unit 150 based on the electric field data detected by the sensor 140. Here, the intensity in the electric field may be calculated by the electric field graph by pad position as illustrated in FIG. 8.

Then, it is determined whether the interconnect circuit board 200 is normal in operation S140. The determining unit 160 determines whether the interconnect circuit board 200 is normal based on the design data of the interconnect circuit board 200 and the previously calculated electric field intensity and resistance value. For example, the design data of the interconnect circuit board 200, in other words, data on positions or a connection structure of a bump, the interconnect 220, the pads 230 and the connection terminals 240 may be previously input to the determining unit 160. In addition, the reference electric field graph of the interconnect circuit board 200 and/or a reference resistance value of interconnects may be previously input to the determining unit 160. Then, the electric field intensity and the resistance value with respect to the tested interconnect circuit board 200 is input from the signal processing unit 150 and the electric field and the resistance value are compared with the reference electric field graph and the reference resistance value. This way, it can be determined whether the interconnect circuit board 200 is normal.

In the method of testing the interconnect circuit according to the current embodiment, it may be determined whether the interconnect circuit board 200 is normal by detecting the electric field only from several second test regions A2 set on the interconnect circuit board 200 or by detecting the electric field from the entire interconnect circuit board 200. For example, in the method of testing the interconnect circuit according to the current embodiment, the interconnect circuit board 200 may be tested in a wafer level. In other words, one wafer may include dozens to hundreds of interconnect circuit boards 200. The electric field is detected from each of the interconnect circuit boards 200 by the method of testing the interconnect circuit according to the current embodiment. This way, it may be determined whether the interconnect circuit board 200 is normal.

When the interconnect circuit board 200 is normal (yes), the method of testing the interconnect circuit is terminated. When the interconnect circuit board 200 is abnormal (no), the cause is analyzed in operation S150. After analyzing the cause, the method of testing the interconnect circuit is terminated. According to an exemplary embodiment of the inventive concept, the method of testing the interconnect circuit may be terminated after determining only whether the interconnect circuit board 200 is normal. In other words, the cause analyzing operation S150 may be omitted from the method of testing the interconnect circuit.

The method of testing the interconnect circuit according to the current embodiment may be used for defect analyzing equipment. For reference, the defect analyzing equipment may analyze which pad or interconnect circuit has problems and/or which part of the interconnect circuit has problems. As described above, the method of testing the interconnect circuit according to the current embodiment may detect the defective pad and/or interconnect by detecting the electric field. Therefore, the method of testing the interconnect circuit according to the current method may be used for the defect analyzing equipment.

Figure 15:
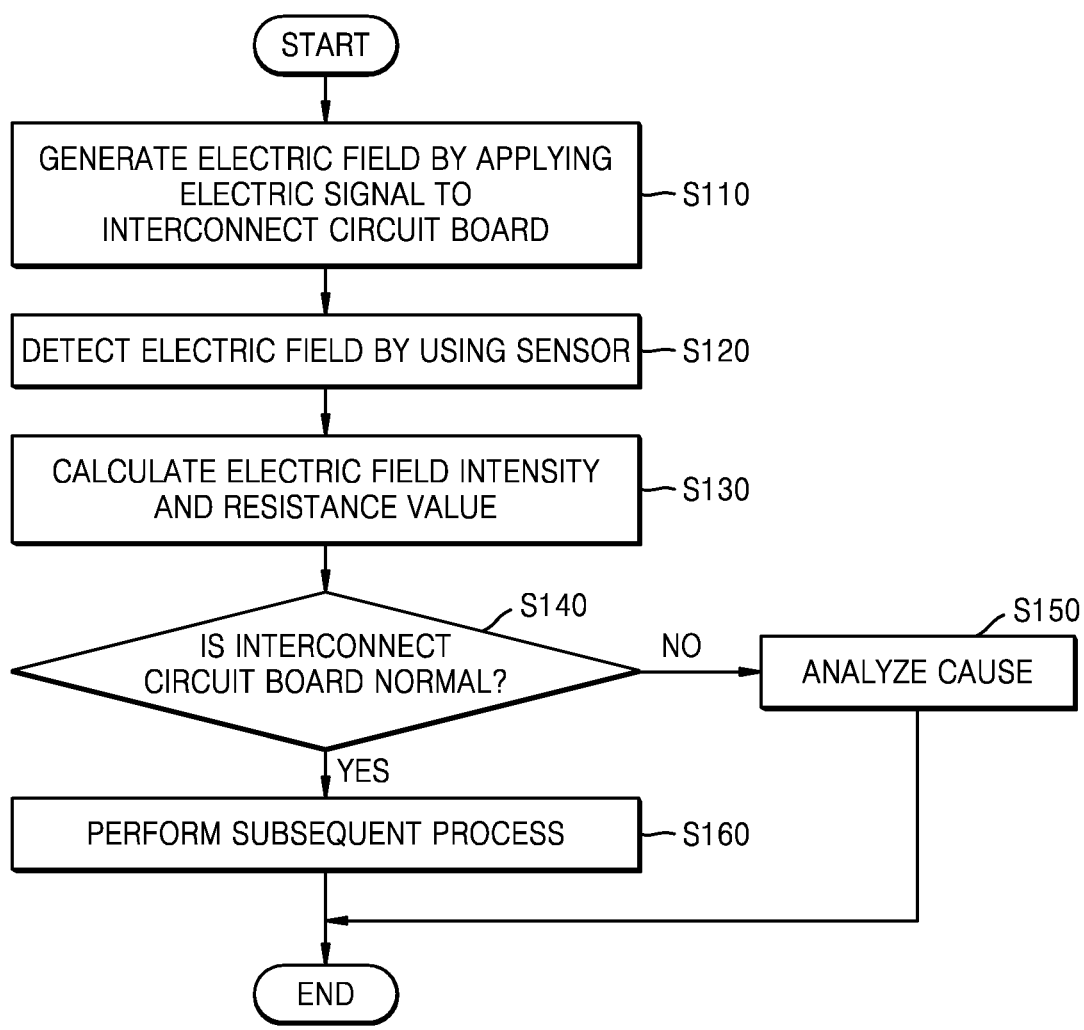
FIG. 15 is a flowchart illustrating a method of manufacturing a semiconductor device including an interconnect circuit testing method according to an exemplary embodiment of the inventive concept.
Figure 16:
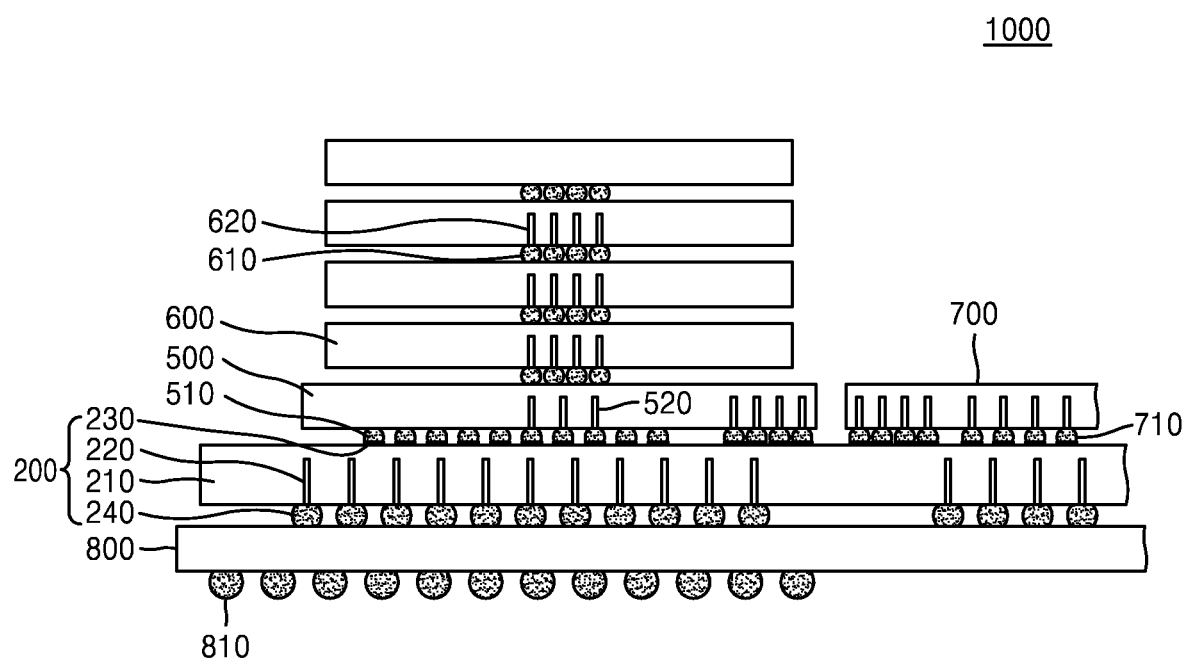
FIG. 16 is a cross-sectional view illustrating a semiconductor device completed through the semiconductor device manufacturing method of FIG. 15 in accordance with an exemplary embodiment of the inventive concept.

FIG. 15 is a flowchart illustrating a method of manufacturing a semiconductor device including an interconnect circuit testing method according to an exemplary embodiment of the inventive concept. FIG. 16 is a cross-sectional view illustrating a semiconductor device 1000 completed through the semiconductor device manufacturing method of FIG. 15. Descriptions previously provided with reference to FIG. 14 are briefly provided or omitted.

Referring to FIG. 15, the electric field generating operation S110, the electric field detecting operation S120, the resistance value calculating operation S130, and the operation of determining whether the interconnect circuit board 200 is normal S140 are sequentially performed. The electric field generating operation S110 to the operation of determining whether the interconnect circuit board 200 is normal S140 are the same as described in FIG. 14.

Next, when the interconnect circuit board 200 is abnormal (no), the cause is analyzed in operation 150 and the method of manufacturing the semiconductor device is terminated. The abnormal interconnect circuit board 200 may be abandoned. On the other hand, when the interconnect circuit board 200 may be repaired, a process of repairing the interconnect circuit board 200 may be performed.

When the interconnect circuit board 200 is normal (yes), subsequent processes are performed on the interconnect circuit board 200 in operation S160. The subsequent processes may include a process of forming a package structure by stacking the semiconductor chips on the interconnect circuit board 200 and sealing the semiconductor chips by a sealing material. The subsequent processes may also include a process of sawing the package structure and dividing the package structure into semiconductor packages. Here, the package structure is obtained by stacking the semiconductor chips on each interconnect circuit board 200 in a wafer level and sealing the semiconductor chips on the wafer by the sealing material. In addition, the subsequent processes may include a process of mounting the semiconductor package on a package substrate such as a main board or a PCB and/or a process of testing the semiconductor package.

As illustrated in FIG. 16, the semiconductor device 1000 manufactured by the method of manufacturing the semiconductor device according to the current embodiment may include the interconnect circuit board 200, semiconductor chips 500, 600, and 700 and a package substrate 800. The interconnect circuit board 200 is the same as that described in reference to FIGS. 1A and 1B. The semiconductor chips 500, 600, and 700 may include a logic chip 500, a memory chip 600, and a processor chip 700. Here, the plurality of memory chips 600 may be stacked. The memory chip 600 may be a high bandwidth memory (HBM) dynamic random access memory (DRAM) chip. However, the memory chip 600 is not limited to the HBM DRAM chip. The processor chip 700 may be a graphics processing unit (GPU)/central processing unit (CPU)/system-on-chip (SOC) chip. The logic chip 500 may include logic devices, integrates signals under the memory chip 600, and may transmit an integrated signal downward. The logic chip 500 may be a buffer chip and the memory chip 600 may be a core chip.

As illustrated in FIG. 16, the semiconductor chips 500, 600, and 700 may be stacked on the interconnect circuit board 200 through fine bumps 510 and 710. In addition, another memory chip 600 may be stacked on the logic chip 500 or yet another memory chip 600 may be disposed under the memory chip 600. The logic chip 500 and the memory chips 600 may be electrically connected through fine bumps 510 and 610, electrodes 520 and 620, and an internal interconnect.

The semiconductor chips 500, 600, and 700 may be stacked on the package substrate 800 with the interconnect circuit board 200 interposed therebetween. The interconnect circuit board 200 includes the substrate 210, the interconnect 220, the pads 230, and the connection terminals 240 and may electrically connect the semiconductor chips 500, 600, and 700 to the package substrate 800. For reference, the number of connection terminals 240 of the interconnect circuit board 200 may be no less than four times greater than the number of fine bumps 510 and 610 of the logic chip 500 and the memory chip 600. In addition, the pads 230 of the interconnect circuit board 200 may be no more than two times to no less than four times the number of pads of the logic chip 500 or the memory chip 600.

The package substrate 800 may include external connection terminals 810 such as solder balls thereunder. Therefore, the semiconductor device 1000 may be mounted on another external board through the external connection terminals 810.

The above structure of the semiconductor device 1000 may be a 2.5D package structure or a 3D structure. The 2.5D package structure and the 3D package structure may be included in a system in package (SIP) structure.

Since the interconnect circuit testing apparatus according to an exemplary embodiment of the inventive concept generates an electric field by applying an electric signal between a first electrode and a second electrode and detects the electric field, it is not necessary for the first and second electrodes to directly contact pads and connection terminals of an interconnect circuit board. In other words, the interconnect circuit testing apparatus of the inventive concept may test the interconnect circuit board by a non-contact method. Therefore, the interconnect circuit testing apparatus of the inventive concept may easily test the interconnect circuit board regardless of the presence of the insulating layer.

In addition, in the interconnect circuit testing apparatus according to an exemplary embodiment of the inventive concept, since the first and second electrodes do not directly contact the pads and the connection terminals, the pads and the connection terminals may not be damaged. In other words, the interconnect circuit testing apparatus of the inventive concept may non-destructively test the interconnect circuit board.

Furthermore, the interconnect circuit testing apparatus according to an exemplary embodiment of the inventive concept may easily test the interconnect circuit board with simple elements at high speed. Therefore, issues associated with conventional contact-type automatic test equipment (ATE) may not be present.

While the inventive concept has been particularly shown and described with reference to exemplary embodiments thereof, it will be understood by those of ordinary skill in the art that various changes in form and details may be made therein without departing from the spirit and scope of the inventive concept as defined by the following claims.

What is claimed is:

1. An interconnect circuit testing apparatus, comprising:
   an electric signal generating circuit for generating an electric signal;
   a first electrode arranged at a first region of a substrate, wherein the substrate includes an interconnect circuit, an upper surface and a lower surface;
   a second electrode arranged at a second region of the substrate; and
   a sensor for detecting an electric field emitted from the first region or the second region when the electric signal is applied to the substrate through the first electrode and the second electrode, wherein the electric signal is applied to the substrate through the first electrode when the first electrode is not in contact with the substrate.

2. The interconnect circuit testing apparatus of claim 1, wherein the first electrode or the second electrode is flat plate-shaped, and
   wherein the first electrode and the second electrode are arranged adjacent to the upper surface or the lower surface of the substrate, or the substrate is arranged between the first electrode and the second electrode.

3. The interconnect circuit testing apparatus of claim 1, wherein the sensor includes a current meter, and
   wherein the sensor detects the electric field by using antennas and measures current corresponding to the electric field with the current meter.

4. The interconnect circuit testing apparatus of claim 1, wherein the sensor includes an electro-optic crystal; and
   wherein the electro-optic crystal is arranged between the substrate and the first electrode or between the substrate and the second electrode, and a reflecting plate is formed on a surface of the electro-optic crystal that faces the substrate, and
   wherein a refractive index of the electro-optic crystal changes or, a direction of crystals in the electro-optic crystal changes in accordance with an intensity of the electric field.

5. The interconnect circuit testing apparatus of claim 4, wherein the first electrode or the second electrode adjacent to the electro-optic crystal is transparent,
   wherein the sensor comprises:
   the electro-optic crystal;
   an illuminating unit for generating light;
   an optical device for making the light from the illuminating unit incident on the electro-optic crystal and making the light reflected from the electro-optic crystal incident on an electro-optic converter; and
   the electro-optic converter for converting the light incident from the optical device into an electric signal,
   wherein the first electrode or the second electrode is arranged between the electro-optic crystal and the optical device.

6. The interconnect circuit testing apparatus of claim 1, wherein the sensor covers the entire first region, the entire second region, a part of the first region or a part of the second region;

wherein, when the sensor covers a part of the first or second region, the sensor detects the electric field by scanning the first region or the second region.

7. The interconnect circuit testing apparatus of claim 1, wherein the first electrode, the second electrode, or the sensor is separate from the substrate.

8. The interconnect circuit testing apparatus of claim 1, further comprising:

a signal processing unit for calculating an intensity of the electric field at a pad and a resistance value of a corresponding interconnect from detected electric field data from the sensor; and a determining unit for determining whether the interconnect circuit is normal based on the intensity of the electric field and the resistance value.

9. An interconnect circuit testing apparatus, comprising:

a first electrode disposed at a first region of an interconnect circuit board;

a second electrode disposed at a second region of the interconnect circuit board, wherein the first electrode and the second electrode each have a flat plate shape;

an electric signal generating circuit for generating an electric signal and applying the electric signal to the first and second electrodes, wherein an electric field is emitted from the interconnect circuit board in response to a potential difference between the first and second electrodes; and a sensor disposed at the second region of the interconnect circuit board, wherein the sensor detects an intensity of the electric field.

10. The interconnect circuit testing apparatus of claim 9, wherein the first electrode and the second electrode are disposed at opposite sides of the interconnect circuit board.

11. The interconnect circuit testing apparatus of claim 9, wherein the first electrode and the second electrode are disposed at the same side of the interconnect circuit board.

12. The interconnect circuit testing apparatus of claim 9, wherein the sensor is disposed between the second electrode and the interconnect circuit board.

13. The interconnect circuit testing apparatus of claim 9, wherein the second electrode is a transparent electrode.

* * * * *